US 11,980,103 B2

(12) United States Patent
Ueno et al.

(10) Patent No.: US 11,980,103 B2
(45) Date of Patent: May 7, 2024

(54) POWER GENERATION ELEMENT AND ACTUATOR

(71) Applicant: NATIONAL UNIVERSITY CORPORATION KANAZAWA UNIVERSITY, Ishikawa (JP)

(72) Inventors: Toshiyuki Ueno, Ishikawa (JP); Tamotsu Minamitani, Ishikawa (JP)

(73) Assignee: NATIONAL UNIVERSITY CORPORATION KANAZAWA UNIVERSITY, Ishikawa (JP)

( * ) Notice: Subject to any disclaimer, the term of this patent is extended or adjusted under 35 U.S.C. 154(b) by 528 days.

(21) Appl. No.: 17/284,742

(22) PCT Filed: Mar. 8, 2019

(86) PCT No.: PCT/JP2019/009299
§ 371 (c)(1),
(2) Date: Apr. 12, 2021

(87) PCT Pub. No.: WO2020/079863
PCT Pub. Date: Apr. 23, 2020

(65) Prior Publication Data
US 2021/0351339 A1    Nov. 11, 2021

(30) Foreign Application Priority Data
Oct. 19, 2018   (JP) ................. 2018-197521

(51) Int. Cl.
*H10N 35/00*    (2023.01)
(52) U.S. Cl.
CPC ................... *H10N 35/00* (2023.02)
(58) Field of Classification Search
CPC .......... H02N 35/00; H02N 2/186; H02N 2/18; H02N 39/00; F03G 7/065
(Continued)

(56) References Cited

U.S. PATENT DOCUMENTS 4,191,937 A * 3/1980 Koehler ................. H01H 51/22
335/79
2008/0246346 A1  10/2008 Harris
(Continued)

FOREIGN PATENT DOCUMENTS

JP    2001-86723 A    3/2001
JP    2007-531482 A   11/2007
(Continued)

OTHER PUBLICATIONS

International Search Report for corresponding Application No. PCT/JP2019/009299, dated May 28, 2019.
(Continued)

*Primary Examiner* — Terrance L Kenerly
(74) *Attorney, Agent, or Firm* — Renner, Otto, Boisselle & Sklar, LLP

(57) ABSTRACT

A power generation element and an actuator for vibration power generation is provided that can be mass-produced at low cost while achieving increase in electromotive force. A power generation element includes a main series magnetic circuit having a frame yoke made of magnetic material and provided with a fixed portion that is one end and a free portion that is the other end across a U-shaped bent portion, a main magnet that applies a magnetic bias to the frame yoke, and a first gap formed at a position in contact with the free portion; and an auxiliary series magnetic circuit having an auxiliary yoke made of magnetic material and attached to the frame yoke, an auxiliary magnet that gives a magnetic bias to the auxiliary yoke, a second gap formed at a position facing the first gap across the free portion, the frame yoke, the main magnet, and the first gap. The amount of change in a main magnetic flux passing in a coil wound around the frame yoke increases when the free portion vibrates due to application of an external force and a magnetic resistance of (Continued)

the first gap and a magnetic resistance of the second gap increase or decrease reciprocally.

8 Claims, 19 Drawing Sheets

(58) Field of Classification Search
USPC .................................. 310/26; 331/156, 157
See application file for complete search history.

(56) References Cited

U.S. PATENT DOCUMENTS

| | | | | |
|---|---|---|---|---|
| 2010/0172775 | A1* | 7/2010 | Onuma | F04D 29/048 |
| | | | | 310/90.5 |
| 2013/0140919 | A1 | 6/2013 | Ikehata | |
| 2014/0346902 | A1* | 11/2014 | Ueno | H10N 35/101 |
| | | | | 310/26 |
| 2017/0093306 | A1 | 3/2017 | Ueno | |
| 2019/0131892 | A1* | 5/2019 | Ueno | H10N 35/101 |

FOREIGN PATENT DOCUMENTS

| | | |
|---|---|---|
| JP | 4905820 B2 | 3/2012 |
| JP | 2013-118766 A | 6/2013 |
| JP | 2013118766 A | 6/2013 |
| WO | 2015/141414 A1 | 9/2015 |

OTHER PUBLICATIONS

Inventor's Declaration as to Non-Prejudicial Disclosures or Exception to Lack of Novelty, filed in corresponding Japanese Application No. 2018-197521 and International Application No. PCT/JP2019/009299.

Taiwan Office Action dated Jun. 29, 2022, with translation, for corresponding TW Application No. 108107764.

\* cited by examiner

FIG. 1
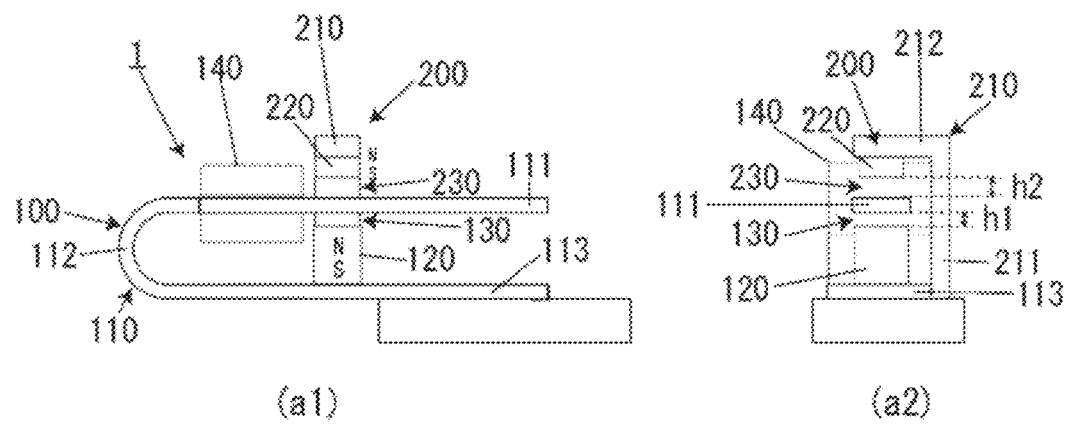
(a1) (a2)
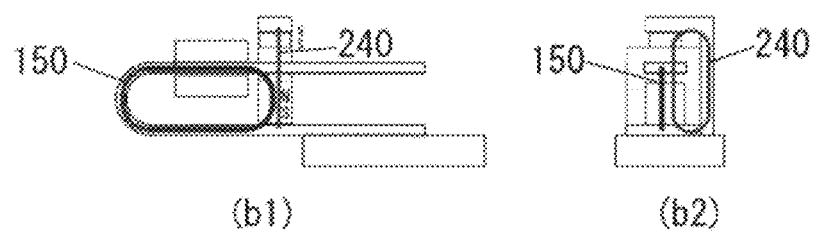
(b1) (b2)
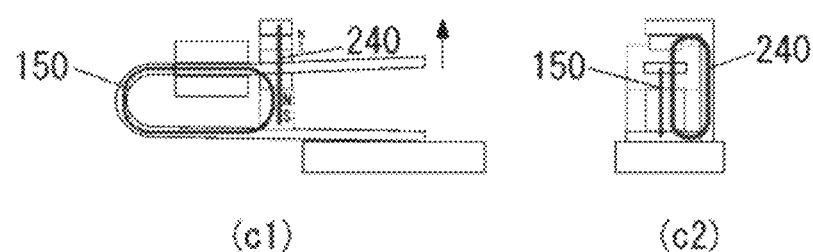
(c1) (c2)
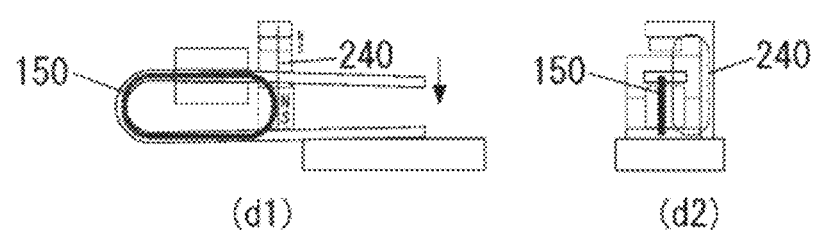
(d1) (d2)

FIG. 7
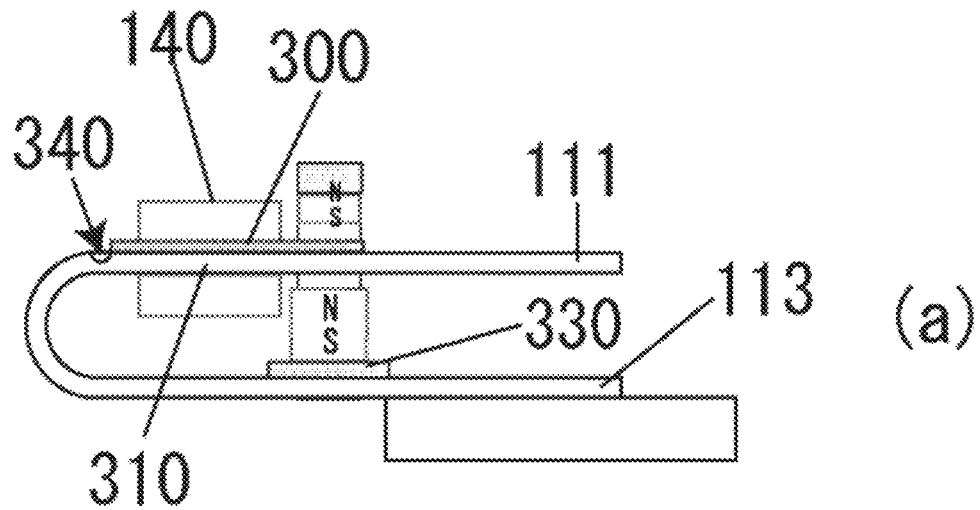
(a)
(b)
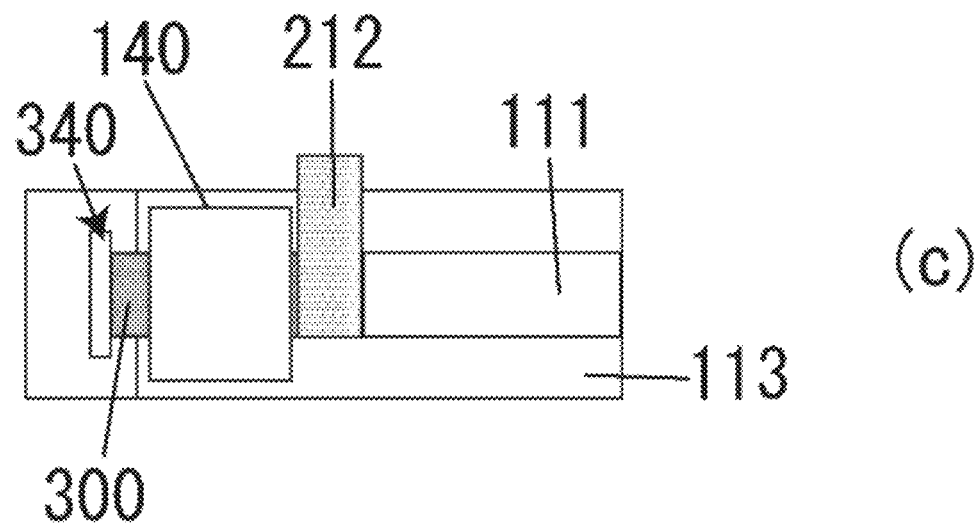
(c)

(a)            (b)

FIG. 13
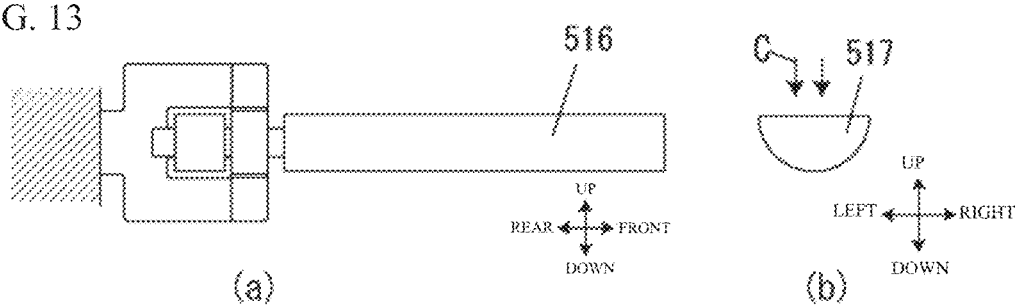
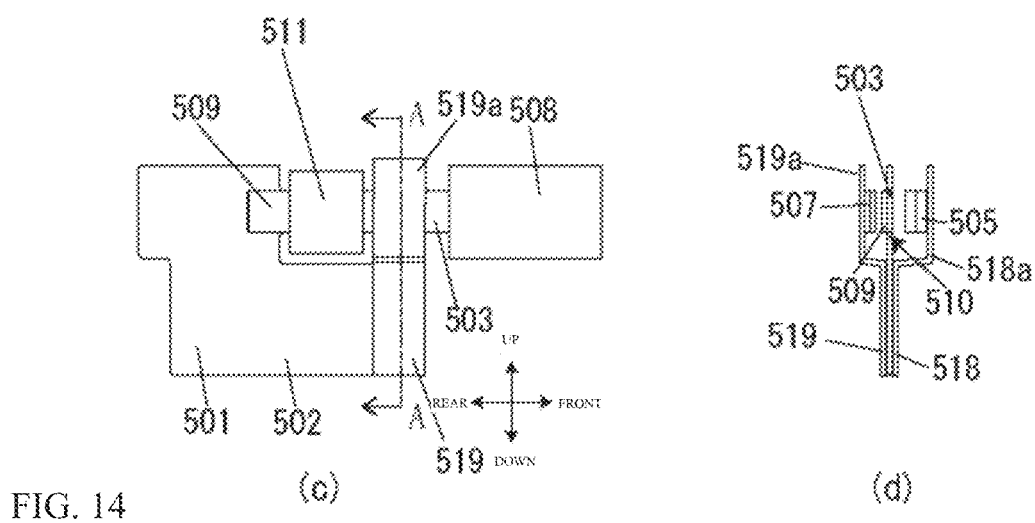
FIG. 14
MODEL 1 (WITH MAGNETOSTRICTIVE PLATE AND AUXILIARY MAGNET)
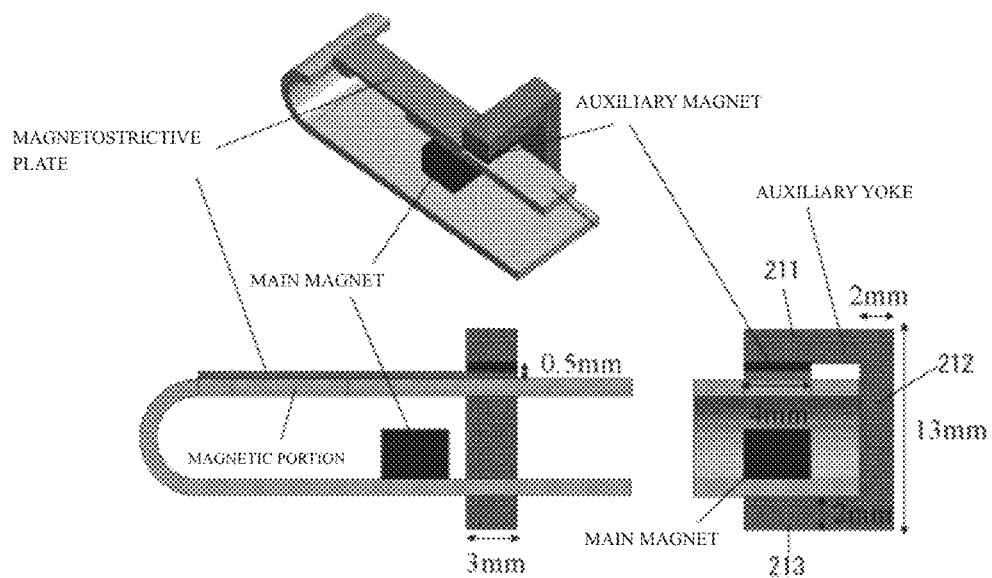

FIG. 17

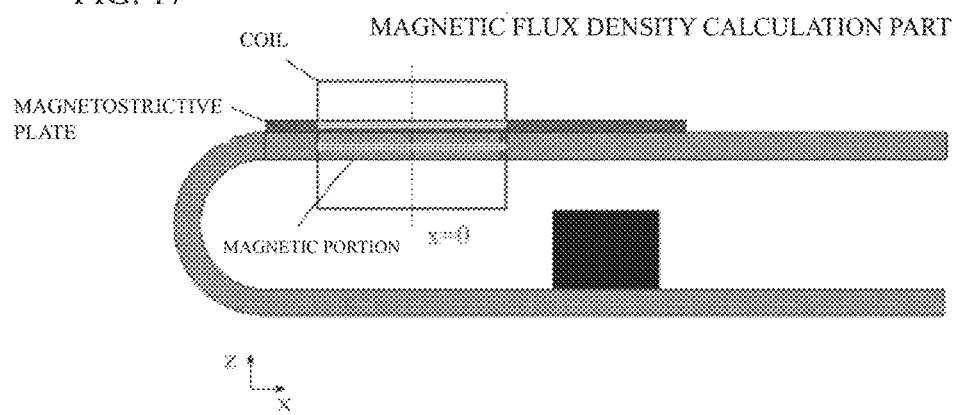

- Calculate x component of magnetic flux density of parallel beam portion (magnetostrictive plate and magnetic portion) around which coil is wound.
- Amount of change in magnetic flux density is average of compressive stress from tensile stress to compressive stress of parallel beam portion.
- X component of magnetic flux density contributes to voltage generated by coil.
- Generated voltage is sum of magnetic fluxes of magnetostrictive plate and magnetic portion.

FIG. 18

MAGNETIC FLUX DENSITY CALCULATION MODEL

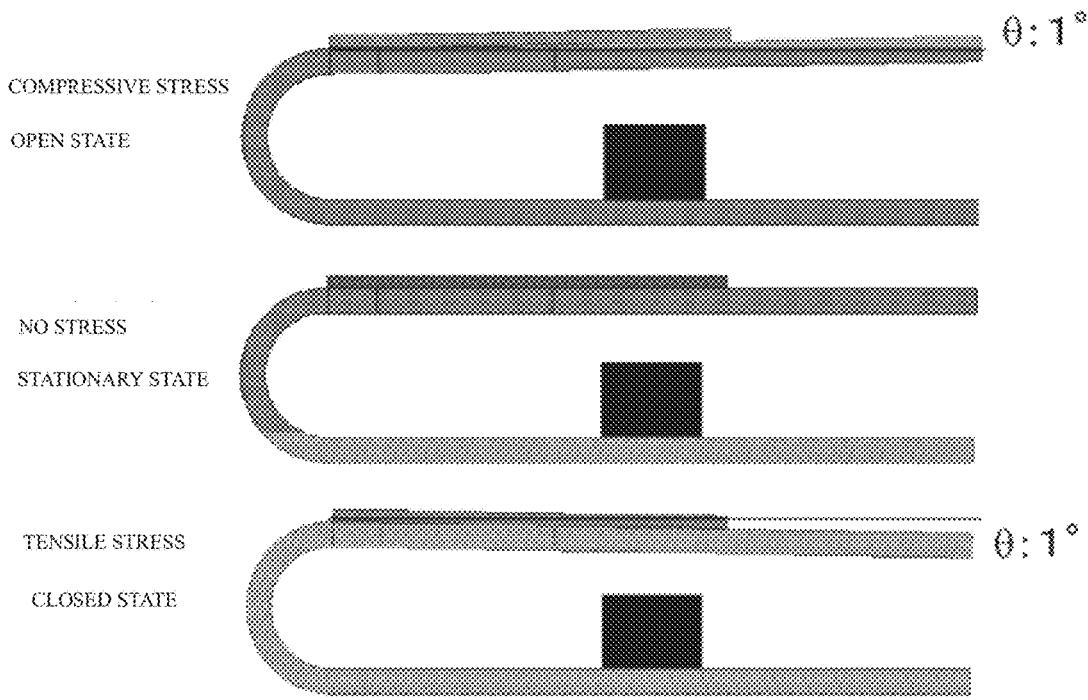

ANALYZING MAGNETIC FLUX DENSITY IN THREE MODES

FIG. 19
EXAMPLE OF MAGNETIC FLUX DENSITY.
MODEL 1 (WITH MAGNETOSTRICTIVE PLATE, WITH AUXILIARY MAGNET)
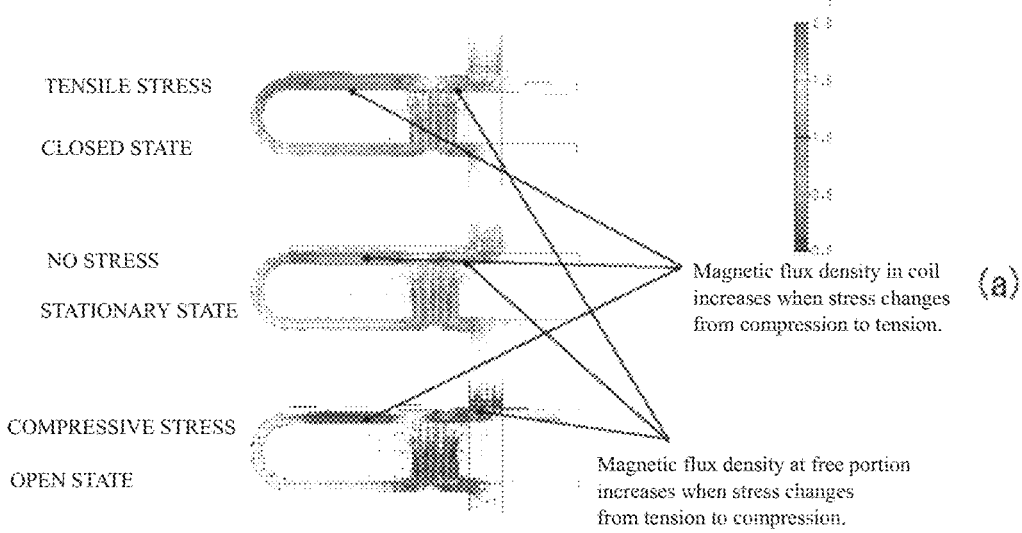
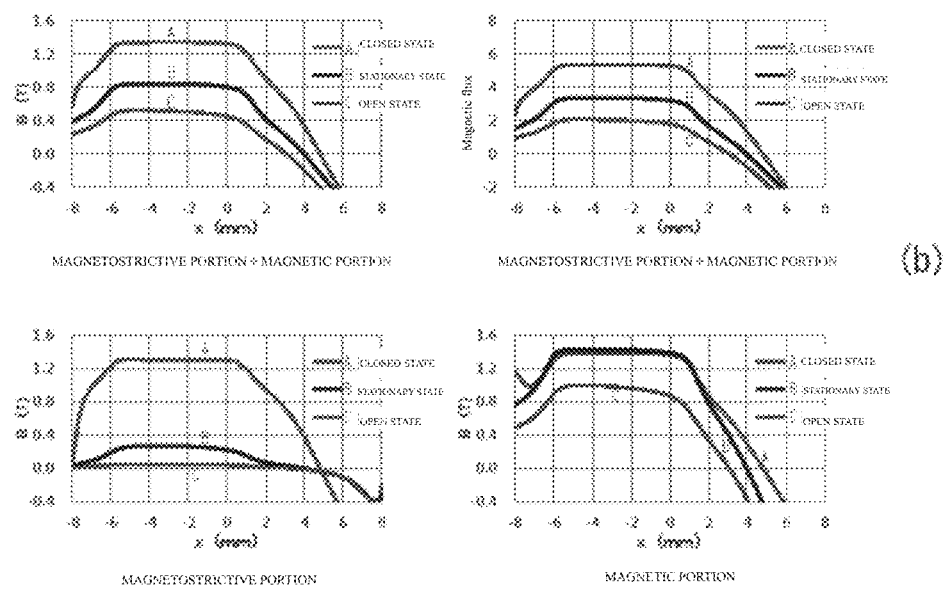

FIG. 20
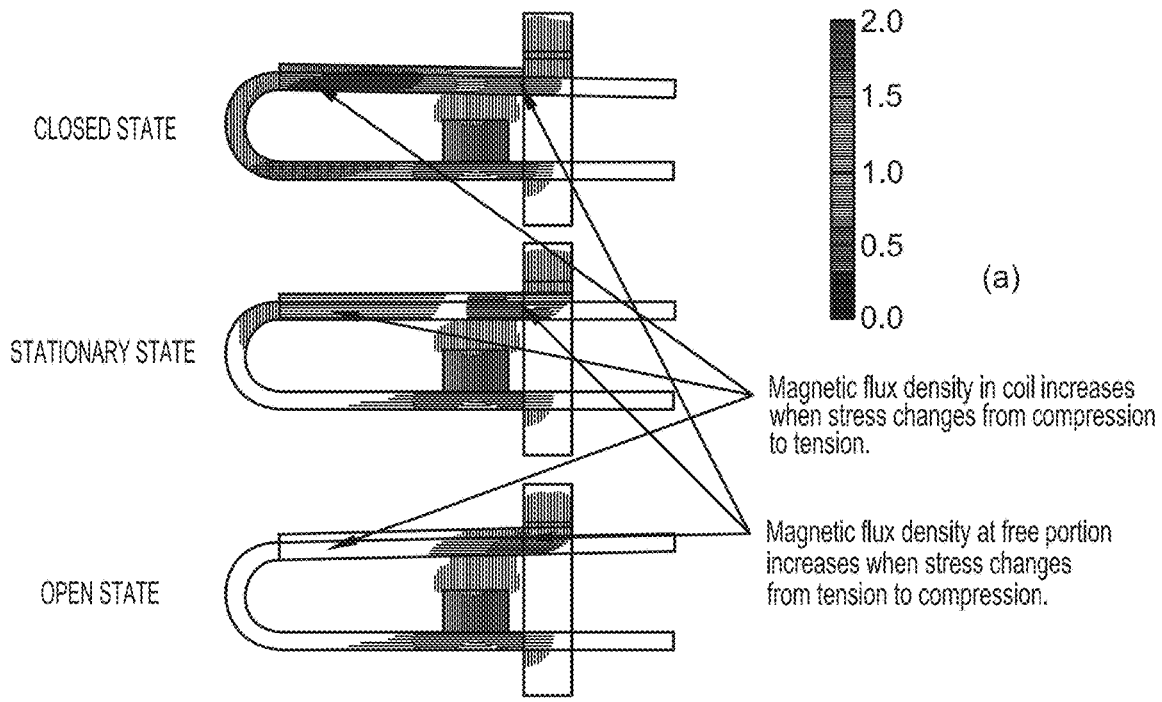
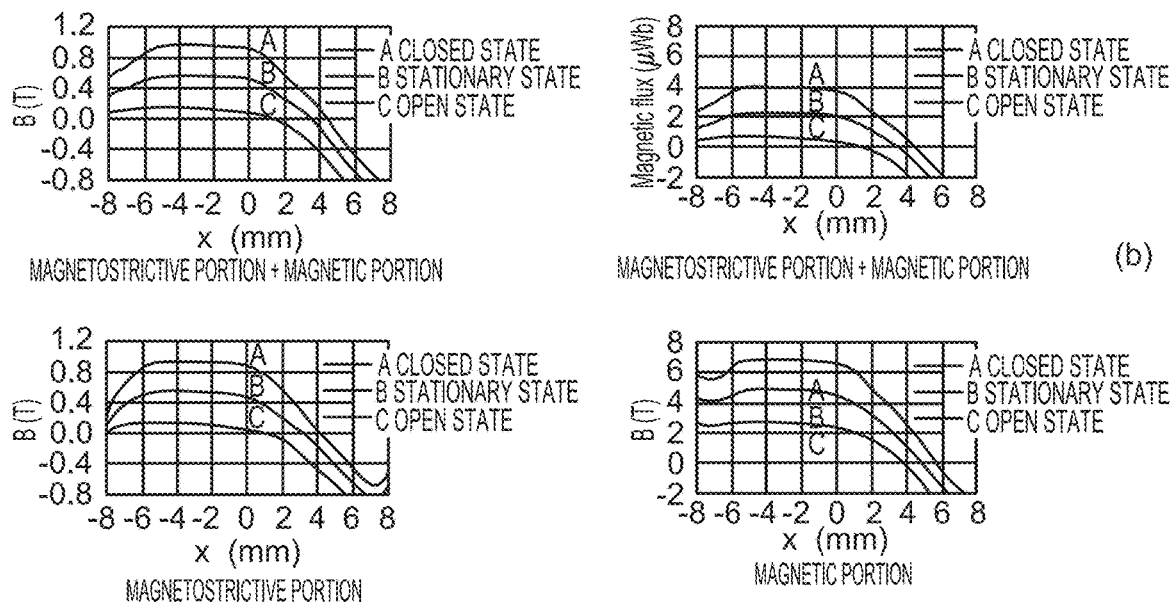

FIG. 21

Example of magnetic flux density.
Model 3 (With magnetostrictive plate, without auxiliary magnet and auxiliary yoke)

TENSILE STRESS
CLOSED STATE

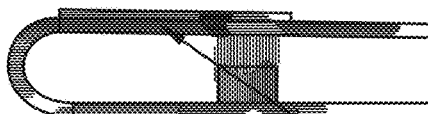

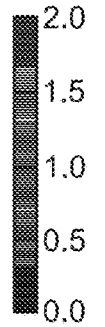

NO STRESS
STATIONARY STATE

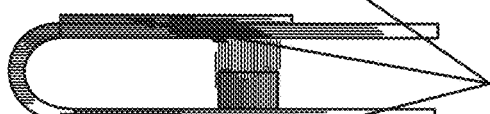

(a)

Magnetic flux density at magnetorespective increases when stress changes from compression to tension.

COMPRESSIVE STRESS
OPEN STATE

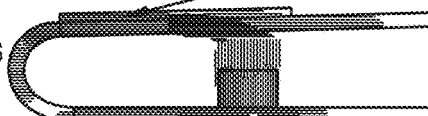

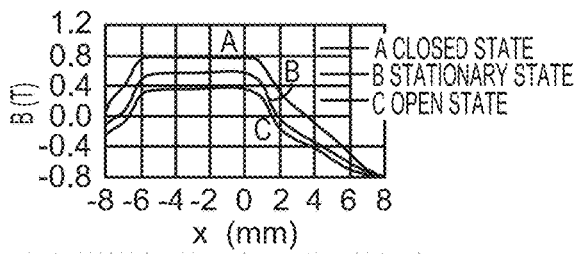
MAGNETOSTRICTIVE PORTION + MAGNETIC PORTION

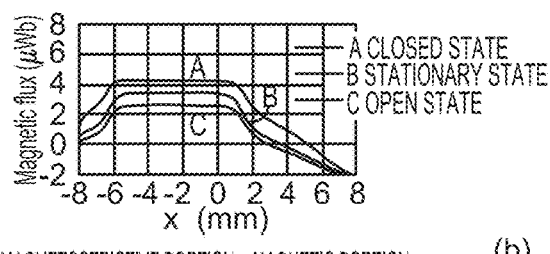
MAGNETOSTRICTIVE PORTION + MAGNETIC PORTION (b)

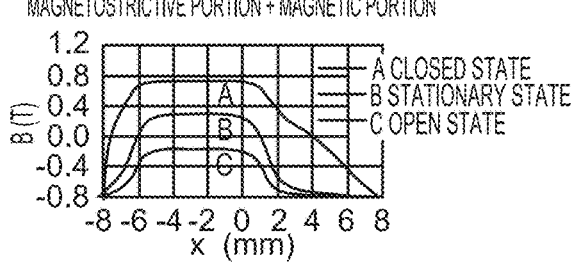
MAGNETOSTRICTIVE PORTION

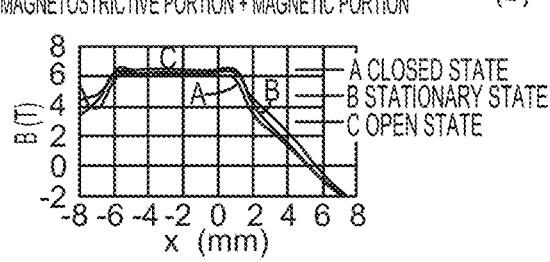
MAGNETIC PORTION

Magnetic flux density at magnetic portion decreases when stress changes from compression to tension

FIG. 22

| Model | Presence of magnetostrictive plate | Presence of auxiliary magnet | Amount of change in magnetic flux (μWb) Magnetostrictive portion + Magnetic portion | Amount of change in magnetic flux density (T) | | | Main magnet size (mm) |
|---|---|---|---|---|---|---|---|
| | | | | Magnetostrictive portion + Magnetic portion | Magnetostrictive portion | Magnetic portion | |
| ① | YES | YES | 3.25 | 0.838 | 1.246 | 0.431 | 4*4*3.5 |
| ② | NO (SUBSTITUTE WITH MAGNETIC MATERIAL) | YES | 3.25 | 0.813 | 0.812 | 0.814 | 4*4*3 |
| ③ | YES | NO | 1.65 | 0.413 | 0.911 | -0.085 | 4*4*2.5 |

FIG. 23
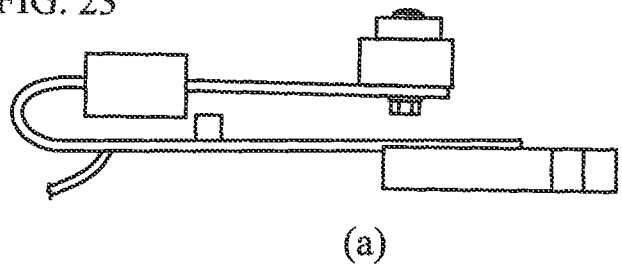
(a)
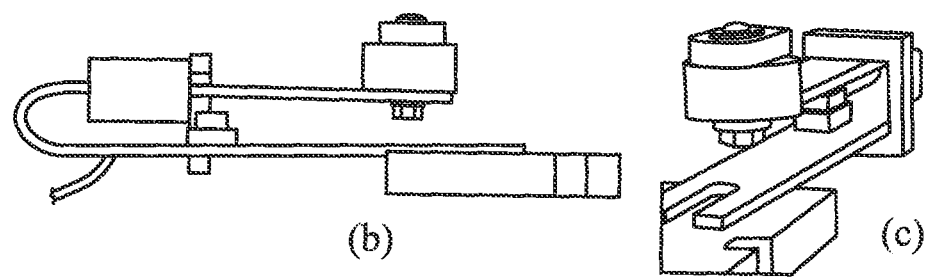
(b)        (c)
FIG. 24
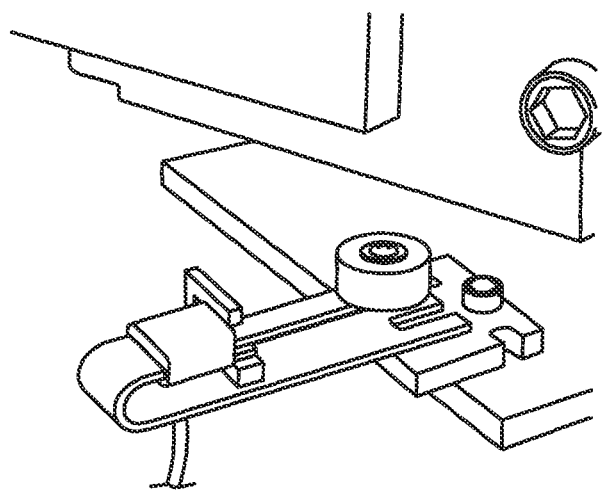

POWER GENERATION ELEMENT AND ACTUATOR

TECHNICAL FIELD

The present invention relates to a power generation element and an actuator for vibration power generation.

BACKGROUND ART

In recent years, the development of technology for generating power by utilizing familiar vibration has been progressing. One of such technologies is one that utilizes a magnetostrictive effect of a ferromagnet.

The magnetostrictive effect refers to the effect in which ferromagnetic material deforms when a magnetic field is applied to the ferromagnetic material (i.e., when the ferromagnetic material is magnetized). Material that undergoes a large amount of deformation due to the magnetostrictive effect is called magnetostrictive material.

The magnetostrictive material also exhibits inverse magnetostrictive effect in which, when an external force is applied to the magnetostrictive material, the magnetostrictive material deforms and the magnetization (magnetic field lines) thereof changes greatly due to the compressive/tensile stress generated inside thereof. For example, magnetic field lines of some known magnetostrictive material change by 1 tesla or more when a compressive force acts thereon. Power generation elements that utilize the temporal change of magnetic flux due to the inverse magnetostrictive effect are attracting attention because such power generation elements can generate power with high efficiency even when an external force of small magnitude is applied thereto (Patent Literatures 1 and 2).

FIG. 27(a) shows a general configuration of a power generation element that utilizes an inverse magnetostrictive effect.

This power generation element includes a power generation unit, a frame yoke, and a magnet.

The power generation unit includes a magnetostrictive plate made of the magnetostrictive material, a coil wound around the magnetostrictive plate, and a magnetic portion. The magnetic portion is arranged parallel to the magnetostrictive plate and has rigidity and shape that allows applying a uniform compressive or tensile force to the magnetostrictive plate.

The frame yoke is made of magnetic material that is bent in a U-shape but with sharp corners. One portion of the frame yoke is a fixed portion, the other portion is a free portion, and a bent portion interposed between the free portion and the fixed portions. A width of the free portion is narrower than that of the fixed portion and the bent portion. This narrowed portion corresponds to the magnetic portion. The magnetostrictive plate is fixed on an upper surface of the magnetic portion. The magnet is attached to an inner surface (upper surface) of the fixed portion. A gap is secured between the magnet and an inner surface (lower surface) of the free portion.

Starting from a stationary state shown in FIG. 27(b), the power generation element drives a vibration source to vibrate the free portion and the fixed portion. As the free portion and the fixed portion vibrate, compressive stress is generated inside the magnetostrictive plate when the free portion and the fixed portion are open as shown in an open state in FIG. 27(c), and tensile stress is generated when they are nearer as shown in a closed state in FIG. 27(d). By this action, power is generated in the power generation unit due to the inverse magnetostrictive effect.

CITATION LIST

Patent Literatures

[Patent Literature 1] JP 4905820 B2
[Patent Literature 2] WO 2015/141414 A1

SUMMARY

Technical Problem

However, the above-mentioned conventional technique has the following problems.

When the free portion and the fixed portion vibrate due to the application of an external force, the stress generated inside the magnetostrictive plate changes from compression to tension, as shown in FIG. 28, the magnetic flux density of the magnetic flux passing through the magnetostrictive plate increases (see arrow A), while the magnetic flux density of the magnetic flux passing through the magnetic portion decreases (see arrow B). The electromotive force (induced voltage or induced current) in the power generation unit is proportional to the magnitude of the temporal change of the magnetic flux (magnetic field line) passing in the coil. If the magnetic flux density of the magnetic flux passing through the magnetic portion decreases/increases when the magnetic flux density of the magnetic flux passing through the magnetostrictive plate increases/decreases as in the prior art, it lowers the electromotive force.

Further, since the manufacturing cost of the power generation element increases when the magnetostrictive material is used, a power generation element for vibration power generation that can be mass-produced at a lower cost may be required.

In consideration of the above discussion, one object of the present invention is to provide a power generation element and an actuator for vibration power generation that can be mass-produced at low cost while achieving increase in the electromotive force.

Solution to Problem

In a power generation element according to one aspect of the present invention, a main series magnetic circuit includes a frame yoke made of magnetic material and provided with a fixed portion and a free portion, a main magnet that applies a magnetic bias to the frame yoke, and a first gap formed at a position in contact with the free portion; and an auxiliary series magnetic circuit includes an auxiliary yoke made of magnetic material and attached to the frame yoke, an auxiliary magnet that applies a magnetic bias to the auxiliary yoke, and a second gap formed at a position facing the first gap across the free portion, the frame yoke, the main magnet, and the first gap, wherein, when a magnetic flux passing through the main series magnetic circuit is taken as a main magnetic flux and a magnetic flux passing through the auxiliary series magnetic circuit is taken as an auxiliary magnetic flux, directions of the main magnetic flux and the auxiliary magnetic flux passing through the first gap are the same, and wherein, utilizing a fact that the free portion vibrates due to application of an external force and a magnetic resistance of the first gap and a magnetic resistance of the second gap increase or decrease reciprocally, an amount of change in the main magnetic flux passing in a coil wound around the frame yoke increases.

Further, one end of the frame yoke is the fixed portion and the other end is the free portion with a U-shaped bent portion in between the free portion and the fixed portion.

Further, the power generation element further includes a magnetic portion formed in a part of the frame yoke; and a magnetostrictive plate made of magnetostrictive material, wherein the magnetic portion has rigidity and shape that allows applying a uniform compressive force or tensile force to the magnetostrictive plate; wherein the magnetostrictive plate is attached to the frame yoke so as to be parallel to the magnetic portion; and wherein the magnetostrictive plate expands or contracts due to the application of an external force.

An actuator according to another aspect of the present invention has the same structure as the power generation element as above described, wherein a length of the first gap changes and the free portion vibrates when an electric current passes through the coil.

An actuator according to still another aspect of the present invention has the same structure as the power generation element as described above, wherein the magnetostrictive plate is expanded and contracted and the free portion vibrates when an electric current passes through the coil.

Advantageous Effects of the Invention

In the present invention, the amount of change in the main magnetic flux passing in the coil increases by utilizing the fact that the magnetic resistances of the first gap and the second gap increase and decrease reciprocally when the free portion vibrates due to the application of the external force, thereby the electromotive force can be increased as compared with the conventional power generation element.

Further, even if the power generation element is not provided with the magnetostrictive plate, the amount of change in the main magnetic flux can be increased, so that the power generation element can be mass-produced at a lower cost.

Further, when the power generation element is provided with the magnetostrictive plate, since the timing of decrease/ increase in the magnetic flux density of the main magnetic flux due to the vibration of the free portion and the reciprocal increase or decrease of the magnetic resistance of the first gap and the second gap and the timing of decrease/increase in magnetic flux density of the main magnetic flux due to changes in compressive stress/tensile stress generated in the magnetostrictive plate can be matched, the electromotive force can be further increased.

Since the length of the first gap changes due to the magnetic field generated from the coil if an electric current is passed through the coil for the power generation element having the above configuration, the magnetostrictive plate expands and contracts, and the free portion of the frame yoke vibrates, the power generation element can function as an actuator.

BRIEF DESCRIPTION OF THE DRAWINGS

FIG. 1 includes a vertical sectional view (a1) and a front view (a2) showing a structure of a power generation element according to a first embodiment, a vertical sectional view (b1) and a front view (b2) showing the power generation element in a stationary state, and a vertical cross-sectional view (e1) and a front view (c2) showing the power generation element in an open state, and a vertical cross-sectional view (d1) and a front view (d2) showing the power generation element in a closed state.

FIG. 7 includes a vertical cross-sectional view (a) showing a power generation element according to a fourth embodiment, an enlarged view (b) of an end portion of a magnetostrictive plate 300 and a groove, and a plan view of the power generation element.

FIG. 13 includes a right sectional view (a) of a modified example of the power generation element according to the eighth embodiment, a vertical sectional view (b) of a wind receiving member, and a left side view (c) and an A-A line sectional view showing another modified example.

FIG. 14 is a diagram showing a structure of Model 1 of Example 1.

FIG. 17 is a diagram showing a calculation method of a magnetic flux density.

FIG. 18 is a diagram showing a magnetic flux density calculation model.

FIG. 19 includes a schematic diagram (a) and graphs (b) showing the distribution of the magnetic flux density of Model 1.

FIG. 20 includes a schematic diagram (a) and graphs (b) showing the distribution of the magnetic flux density of Model 2.

FIG. 21 includes a schematic diagram (a) and graphs (b) showing the distribution of the magnetic flux density of Model 3.

FIG. 22 is a table showing the amount of change in magnetic flux and the amount of change in magnetic flux density of Models 1 to 3.

FIG. 23 are photographs (a) to (c) showing a structure of a power generation element of Example 2.

FIG. 24 is a photograph showing a state in which a power generation element is attached to a vibrator.

DETAILED DESCRIPTION

First Embodiment

Figure 2:
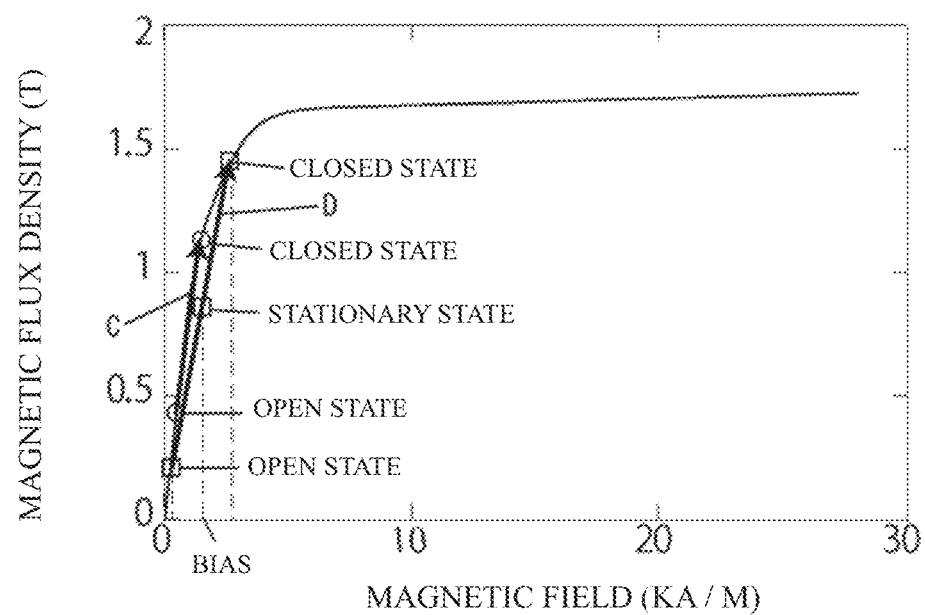
FIG. 2 is a graph of magnetization curves of a frame yoke in the stationary state, the open state, and the closed state.

Next, a first embodiment of a power generation element 1 of the present invention will be described.

As shown in FIGS. 1(a1) and 1(a2), the power generation element 1 according to the present embodiment includes a main series magnetic circuit 100 and an auxiliary series magnetic circuit 200.

The main series magnetic circuit 100 includes a frame yoke 110, a main magnet 120, and a first gap 130.

The frame yoke 110 is made of magnetic material and has a free portion 111 and a fixed portion 113. The frame yoke 110 of the present embodiment has a U-shape in side view. The frame yoke 110 includes the free portion 111, a bent portion 112, and the fixed portion 113, and is made of magnetic material. Carbon steel (SS400, SC, SK material), ferritic stainless steel (SUS430), etc. can be used as the magnetic material for the frame yoke 110.

The frame yoke 110 is fixedly supported in a so-called cantilever state so that one portion becomes the fixed portion 113 and the other portion becomes the free portion 111 with the bent portion 112 in between the two portions. In the present invention, the "U-shape" with sharp corners also includes a so-called "U-shape" with smooth corners that bend smoothly from the free portion 111 side of the frame yoke 110 to the fixed portion 113 side, and also includes a so-called "V-shape" in which the distance between the free portion 111 and the fixed portion 113 gradually widens as one goes from the bent portion 112 toward the tips of the free portion 111 and the fixed portion 113.

As shown in FIG. 1(a2), the widths (lengths in the left-right direction) of the fixed portion 113 and the bent portion 112 are equal, and the width of the free portion 111 is narrower than that of the fixed portion 113 and the bent portion 112.

A weight or a diaphragm for adjusting a resonance frequency during vibration may be attached to the free portion 111 of the frame yoke 110.

A coil 140 is wound around the free portion 111 of the frame yoke 110. The coil 140 generates a voltage in proportion to a temporal change of a magnetic flux passing through an air core portion according to the law of electromagnetic induction. The material of the coil 140 is not particularly limited, but for example, a copper wire can be used. Further, the magnitude of the voltage can be adjusted by changing the number of turns of the coil 140. The position where the coil 140 is wound is not limited to the free portion 111, but may be the fixed portion 113 or the bent portion 112. Alternatively, a plurality of the coils 140 may be wound around the frame yoke 110.

A metal fitting for fixing the power generation element 1 to a vibration source may be attached to the fixed portion 113 of the frame yoke 110.

The main magnet 120 applies a magnetic bias to the frame yoke 110. The main magnet 120 of the present embodiment is a permanent magnet. The S pole side of the main magnet 120 is fixed to an inner surface (upper surface) of the fixed portion 113. An electromagnet may be used as the main magnet 120 instead of a permanent magnet. An electromagnet is advantageous in that the amount of magnetic bias to each part constituting the main series magnetic circuit 100 can be adjusted by adjusting the electric current flowing through a coil of the electromagnet. Further, if the power generation element 1 is to be up-sized, it becomes difficult to use a neodymium iron boron-based permanent magnet. The reason is that large permanent magnets are expensive and difficult to assemble due to the strong magnetic force they produce. As described above, it is suitable to use an electromagnet for the large power generation element 1. In the case where an electromagnet is used as the main magnet 120, a part of the inner surface of the fixed portion 113 is projected upward and the coil of the electromagnet may be wound around this projecting part, or the coil of the electromagnet may be directly wound around a part of the frame yoke 110.

The first gap 130 is a space formed at a position in contact with the free portion 111. In the present embodiment, a space between a lower surface of the free portion 111 and the N pole side, that is, an upper part, of the main magnet 120 is the first gap 130. When the free portion 111 vibrates due to the application of an external force, a length h1 of the first gap 130 changes.

As shown in FIGS. 1(b1) and 1(b2), a main magnetic flux 150 passing through the main series magnetic circuit 100 exits from the N pole of the main magnet 120, passes through the first gap 130, the free portion 111, the bent portion 112 and the fixed portion 113 of the frame yoke 110, and returns to the S pole of the main magnet 120. The main series magnetic circuit 100 is one closed magnetic circuit, and each part constituting the main series magnetic circuit 100 is magnetically biased by the main magnetic flux 150.

The position of the main magnet 120 is not particularly limited as long as the main magnetic flux 150 can be passed through the main series magnetic circuit 100. However, it is preferable to arrange the main magnet 120 in an internal space formed between the fixed portion 113 and the free portion 111.

The auxiliary series magnetic circuit 200 includes an auxiliary yoke 210, an auxiliary magnet 220, a second gap 230, the frame yoke 110, the main magnet 120, and the first gap 130.

Figure 11:
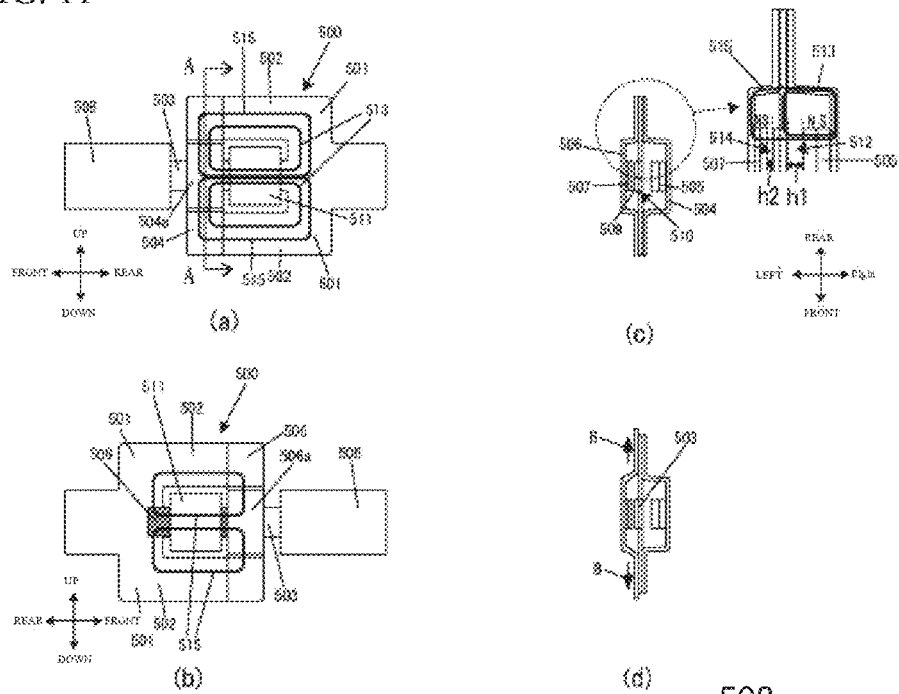
FIG. 11 includes a right side view (a), a left side view (b), an A-A line sectional view and partially enlarged view (c) of a power generation element according to an eighth embodiment, and an A-A line sectional view (d) showing a deformed state.

The auxiliary yoke 210 is made of magnetic material and is attached to the frame yoke 110. Carbon steel (SS400, SC, SK material), ferritic stainless steel (SUS430), etc. can be used as the magnetic material for the auxiliary yoke 210. The auxiliary yoke 210 of the present embodiment has an L-shape in front view with a vertical portion 211 and a horizontal portion 212. A lower end of the vertical portion 211 is fixed to a side surface of the fixed portion 113, and the horizontal portion 212 is extended from an upper end of the vertical portion 211 to a position covering the upper part of the free portion 111. As an alternative shape of the auxiliary yoke 210, for example, as shown in FIG. 11, a second horizontal portion 213 extending in the horizontal direction from the lower end of the vertical portion 211 is provided to form a U-shape in front view, and an upper surface of the second horizontal portion 213 may be fixed to a lower surface of the fixed portion 113.

The auxiliary magnet 220 is a member that applies a magnetic bias to the auxiliary yoke 210. The auxiliary magnet 220 of the present embodiment is a permanent magnet, and the N pole side, that is, an upper portion, thereof is fixed to a lower surface of the horizontal portion 212. An electromagnet may be used as the auxiliary magnet 220 instead of a permanent magnet.

The second gap 230 is a space formed at a position facing the first gap 130 with the free portion 111 in between. In the present embodiment, a space between the S pole side, that is, a lower portion, of the auxiliary magnet 220 and an upper surface of the free portion 111 is the second gap 230. It is said that the first gap 130 and the second gap 230 are formed at positions opposing each other with the free portion 111 in between, but "opposing" means at least the free portion 111 exists between the first gap 130 and the second gap 230.

When the free portion 111 vibrates due to the application of the external force, a length h2 of the second gap 230 changes. That is, when the free portion 111 moves upward and the length h1 of the first gap 130 increases due to the application of the external force, the length h2 of the second gap 230 decreases, and when the free portion 111 moves downward and the length h1 of the first gap 130 decreases, the length h2 of the second gap 230 increases. In other words, a bigger gap is divided into the first gap 130 and the second gap 230 by the free portion 111, and the lengths h1 and h2 reciprocally increase or decrease as the free portion 111 moves up and down. The lengths h1 and h2 need to be set to such a value that prevents the free portion 111, which vibrates in the vertical direction, from coming into contact with the main magnet 120 and the auxiliary magnet 220.

As shown in FIGS. 1(b1) and 1(b2), an auxiliary magnetic flux 240 passing through the auxiliary series magnetic circuit 200 exits from the N pole of the auxiliary magnet 220, passes through the horizontal portion 212 and the vertical portion 211 of the auxiliary yoke 210, passes from the fixed portion 113 of the frame yoke 110, through the main magnet 120, the first gap 130, the free portion 111, and the second gap 230, and returns to the S pole of the auxiliary magnet 220. The auxiliary series magnetic circuit 200 is one closed magnetic circuit, and each part constituting the auxiliary series magnetic circuit 200 is magnetically biased by the auxiliary magnetic flux 240.

The position of the auxiliary magnet 220 is not particularly limited as long as the auxiliary magnetic flux 240 can be passed through the auxiliary series magnetic circuit 200. However, it is preferable that the auxiliary magnet 220 is arranged in an external space, that is, a space other than the internal space between the fixed portion 113 and the free portion 111. However, it is necessary to match the directions of the main magnetic flux 150 and the auxiliary magnetic flux 240 passing through the first gap 130.

Next, the operation of the power generation element 1 will be described.

As shown in FIGS. 1(b1) and 1(b2), when the external force is applied to the power generation element 1 that is stationary in a fixed state to the vibration source to be excited, the free portion 111 and the fixed portion 113 of the frame yoke 110 alternately repeatedly enter a deformed state in which the free portion 111 and the fixed portion 113 are open as shown in FIGS. 1(c1) and 1(c2) (hereinafter, "open state") and a deformed state as shown in FIGS. 1(d1) and 1(d2) (hereinafter, "closed state").

In the open state, the length h1 of the first gap 130 is longer as compared with that in the stationary state. Accordingly, the magnetic resistance of the first gap 130 is higher. In contrast, the length h2 of the second gap 230 is shorter. Accordingly, the magnetic resistance of the second gap 230 is lower. The main magnetic flux 150 decreases due to the increase in the magnetic resistance of the first gap 130, but the magnetic flux equivalent to the reduced magnetic flux passes through the auxiliary series magnetic circuit 200, so that the auxiliary magnetic flux 240 increases.

On the other hand, in the closed state, the length h1 of the first gap 130 is shorter as compared with that in the stationary state. Accordingly, the magnetic resistance of the first gap 130 is lower. In contrast, the length h2 of the second gap 230 is longer. Accordingly, the magnetic resistance of the second gap 230 is lower. The auxiliary magnetic flux 240 decreases due to the increase in the magnetic resistance of the second gap 230, but the magnetic flux equivalent to the reduced magnetic flux passes through the main series magnetic circuit 100, so that the main magnetic flux 150 increases.

In this way, by utilizing the fact that, when the free portion 111 vibrates due to the application of the external force, the magnetic resistances of the first gap 130 and the second gap 230 increase and decrease reciprocally, the amount of change in the main magnetic flux 150 passing in the coil 140 can be increased to increase the electromotive force.

FIG. 2 shows a graph of magnetization curves of the frame yoke 110 in the stationary state, the open state, and the closed state.

When the power generation element 1 does not include the auxiliary series magnetic circuit 200, the magnetic flux changes only from a hollow circle in the open state to a hollow circle in the closed state (see arrow C). On the other hand, when the power generation element 1 includes the auxiliary series magnetic circuit 200 as in the present invention, it can be seen that the magnetic flux changes from a hollow square in the open state to a hollow square in the closed state (see arrow D). Although, even if the power generation element 1 does not include the auxiliary series magnetic circuit 200, the frame yoke 110 can vibrate and the length h1 of the first gap 130 increases or decreases thereby changing the magnetic flux passing through the frame yoke 110 to generate power, the amount of change in the main magnetic flux 150 can be further increased to further increase the electromotive force by providing the auxiliary series magnetic circuit 200 as in the present invention.

Second Embodiment

Next, the second embodiment of the power generation element of the present invention will be described. The same reference numerals will be given to the parts having the same structure as that of the first embodiment, and the description thereof will be omitted.

Figure 3:
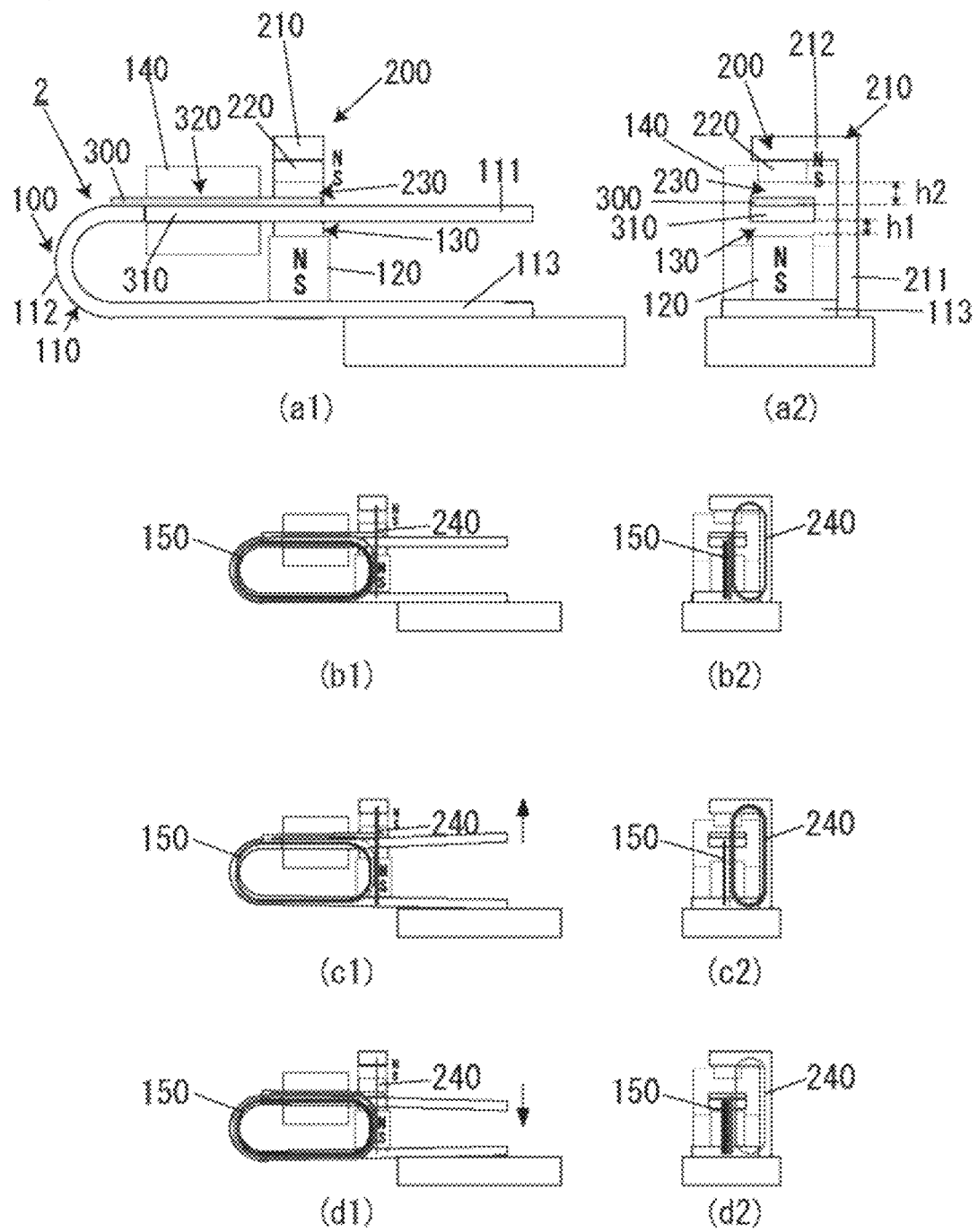
FIG. 3 includes a vertical sectional view (a1) and a front view (a2) showing a structure of a power generation element according to a second embodiment, a vertical sectional view (b1) and a front view (b2) showing the power generation element in a stationary state, and a vertical cross-sectional view (e1) and a front view (c2) showing the power generation element in an open state, a vertical cross-sectional view (d1) and a front view (d2) showing the power generation element in a closed state.

As shown in FIGS. 3(a1) and 3(a2), a power generation element 2 according to the present embodiment includes a magnetostrictive plate 300 and a magnetic portion 310.

The magnetostrictive plate 300 is a rod-shaped member made of magnetostrictive material. Since the magnetostrictive plate 300 contracts/expands when an external force is applied, it is preferable that it is made of ductile magnetostrictive material. The type of magnetostrictive material is not particularly limited, but an iron-gallium alloy can be used, for example, and an iron-cobalt alloy may be used, for example, or known magnetostrictive material such as a Fe-Al or Fe-Si-B alloy can be used. Further, not only the material in the crystalline state but also the material in the amorphous state may be used. Further, in order to increase the change in magnetization with respect to tensile stress, magnetostrictive material to which compressive stress is applied by preliminarily performing stress annealing treatment may be used. The shape of the magnetostrictive plate 300 may be rod-shaped, and examples thereof include a rectangular parallelepiped.

The magnetostrictive plate 300 is attached to an upper surface of the magnetic portion 310 by using any known method such as solder bonding, brazing, resistance welding, laser welding, and ultrasonic bonding.

The magnetic portion 310 is formed on a part of the frame yoke 110. The magnetic portion 310 and the magnetostrictive plate 300 constitute a parallel beam portion 320.

In the present embodiment, the width of a part of the free portion 111 is narrowed in the left-right direction to form the magnetic portion 310. Since the frame yoke 110 is made of magnetic material as described above, the magnetic portion 310 is also made of magnetic material. A space may be secured between the magnetic portion 310 and the magnetostrictive plate 300 by making the magnetic portion 310 thinner in the vertical direction.

The magnetic portion 310 has rigidity and shape that allows applying a uniform compressive force or tensile force to the cross section of the magnetostrictive plate 300 when an external force is applied to the frame yoke 110. That is, the magnetic portion 310 is designed to have rigidity and shape necessary to position a neutral axis (a surface that does not contract/expand when the stress becomes zero) outside the cross section of the magnetostrictive plate 300 when the parallel beam portion 320 bends due to the application of an external force. The condition for the stress in the magnetostrictive plate 300 to be uniform tension or compression is that the neutral axis at which the stress becomes zero exists between the magnetostrictive plate 300 and the magnetic portion 310, or in the magnetic portion 310.

As an example of the shape of the magnetic portion 310, when an Fe-Ga alloy is used as the material of the magnetostrictive plate 300, the width of the magnetic portion 310 on the left and right is preferably about 2 mm and the thickness on the top and bottom is preferably about 0.5 mm. Further, when SUS430, SS400, or SC50 steel is used as the material for the frame yoke 110, the width of the magnetic portion 310 is preferably about 2 mm on the left and right, the thickness is preferably about 0.5 mm on the top and bottom, and the length of the parallel beam portion 320 (magnetostrictive plate 300 and magnetic portion 310) is preferably about 7 mm. Further, when a space is secured between the magnetostrictive plate 300 and the magnetic portion 310, the thickness of the space is preferably about 1 mm.

The coil 140 is wound around the parallel beam portion 320, but the present invention is not limited to this, and the coil 140 may be wound around the fixed portion 113.

When the external force is applied to the power generation element 2 that is stationary in a fixed state to the vibration source to be excited, as shown in FIGS. 3(b1) and 3(b2), the frame yoke 110 alternately repeatedly enters in an open state as shown in FIGS. 3(c1) and 3(c2) and a closed state as shown in FIGS. 3(d1) and 3(d2).

Since the neutral axis (position where the stress is zero) of the parallel beam portion 320 is between the magnetostrictive plate 300 and the magnetic portion 310, the stress inside the magnetostrictive plate 300 becomes uniform compression in the open state and the stress inside the magnetostrictive plate 300 becomes uniform tension in the closed state. As a result, the main magnetic flux 150 passing through the magnetostrictive plate 300 is lower in the open state and higher in the closed state due to the inverse magnetostrictive effect.

As described in the first embodiment, in the open state, the magnetic flux density of the main magnetic flux 150 decreases because the magnetic resistance of the first gap 130 increases. Further, in the present embodiment, the magnetic flux density of the main magnetic flux 150 is also reduced due to compression of the magnetostrictive plate 300. On the other hand, in the closed state, the magnetic flux density of the main magnetic flux 150 increases because the magnetic resistance of the first gap 130 decreases. Further, the extension of the magnetostrictive plate 300 increases the magnetic flux density of the main magnetic flux 150.

Figure 4:
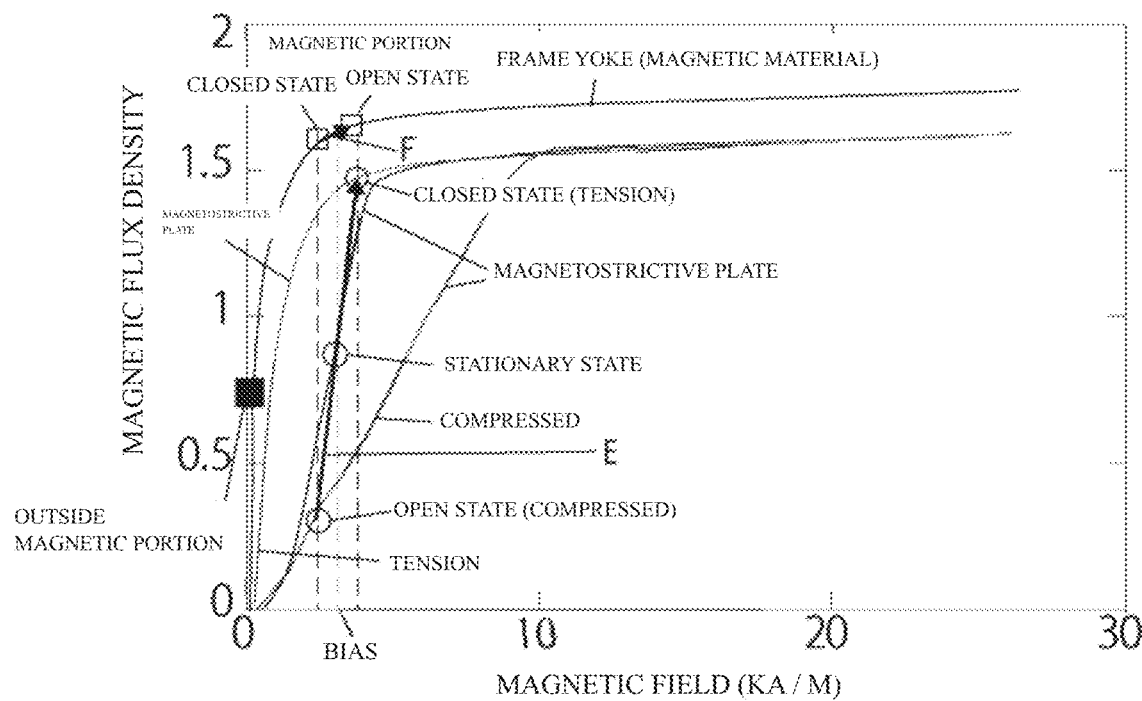
FIG. 4 includes a graph of magnetization curves of the frame yoke and a magnetostrictive plate in the stationary state, the open state, and the closed state.

FIG. 4 shows a graph of magnetization curves of the frame yoke 110 in the stationary state (no external force), the open state (magnetostrictive plate 300 is compressed), and the closed state (magnetostrictive plate 300 is tensioned).

While the stress generated inside the magnetostrictive plate 300 changes from compression to tension, the magnetic flux density of the magnetic flux passing through the magnetostrictive plate 300 increases from a hollow circle to a hollow circle (see arrow E), and further, the magnetic flux density of the magnetic flux passing through the magnetic portion 310 also increases from a hollow square to a hollow square (see arrow F).

In the present embodiment, since the timing of decrease/increase of the magnetic flux density of the main magnetic flux 150 as the free portion 111 vibrates and the magnetic resistances of the first gap 130 and the second gap 230 increase or decrease reciprocally, and the timing of the decrease/increase of the magnetic flux density of the main magnetic flux 150 due to the change of the compressive stress/tensile stress generated in the magnetostrictive plate 300 can be matched, the electromotive force is further increased as compared with the configuration of the first embodiment.

Third Embodiment

Next, the third embodiment of the power generation element of the present invention will be described. The same reference numerals will be given to parts having the same structure as those of the above-described embodiments, and the description thereof will be omitted.

Figure 5:
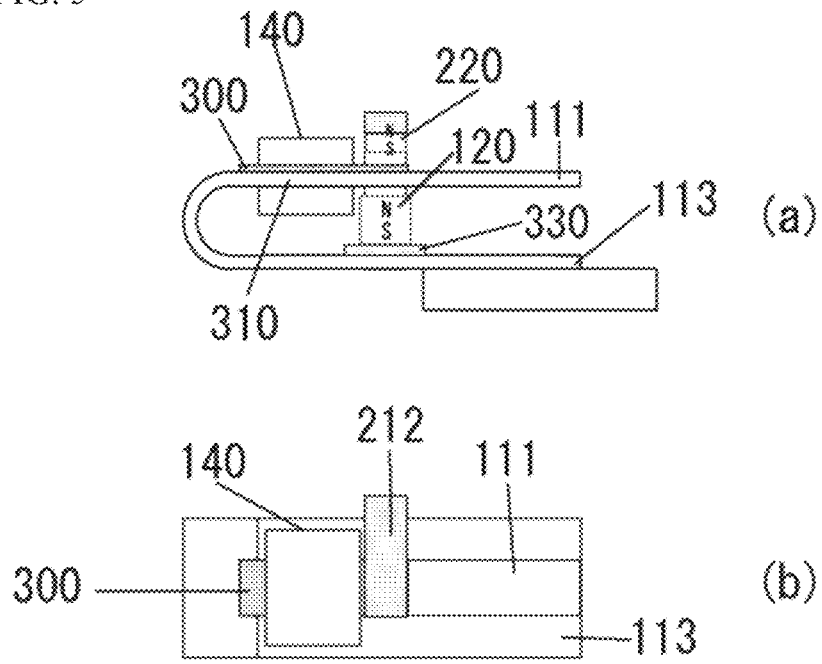
FIG. 5 includes a vertical sectional view (a) and a plan view (b) showing a structure of a power generation element according to a third embodiment.

As shown in FIG. 5, the power generation element of the present embodiment is characterized in that a spacer 330 is provided between the fixed portion 113 and the main magnet 120.

In a configuration having no spacer 330, the magnetic flux density near the position where the inner surface (upper surface) of the fixed portion 113 comes into contact with the end of the main magnet 120 becomes locally high, and magnetic saturation may occur. Local magnetic saturation hinders the passage of the main magnetic flux 150 and reduces the electromotive force. By arranging the spacer 330 between the fixed portion 113 and the main magnet 120 as in the present embodiment, the main magnet 120 does not directly contact the fixed portion 113, and the occurrence of local magnetic saturation can be prevented.

The material of the spacer 330 may be magnetic material or non-magnetic material; however, magnetic material is preferable, because the effect of expanding the magnetic path through which the main magnetic flux 150 passes can be obtained, and the main magnetic flux 150 can easily pass through.

Figure 6:
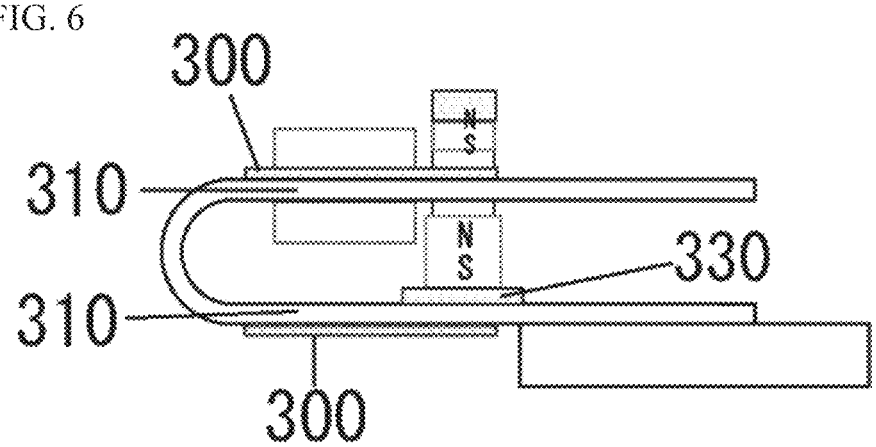
FIG. 6 includes a vertical sectional view showing a modified example of the power generation element.

As shown in FIG. 6, the magnetostrictive plate 300 can be attached to each of the free portion 111 and the fixed portion 113. In this configuration, the magnetic flux density of the main magnetic flux 150 on the fixed portion 113 side to which the main magnet 120 is attached is higher, and the magnetic flux density of the main magnetic flux 150 on the free portion 111 side is lower. As a result, the characteristics of the magnetostrictive plate 300 on the free portion 111 side and the characteristics of the magnetostrictive plate 300 on the fixed portion 113 side are different, and there is a problem that the magnetic flux does not easily flow. In contrast, as in the present embodiment, by arranging the spacer 330 between the fixed portion 113 and the main magnet 120, the distance from the upper surface of the fixed portion 113 to the main magnet 120 and the distance from the main magnet 120 to the lower surface of the free portion 111 are made almost equal. Therefore, the magnetic flux densities of the main magnetic flux 150 of the fixed portion 113 and the free portion 111 become almost equal, and the characteristics of the magnetostrictive plate 300 on the fixed portion 113 side and the characteristics of the magnetostrictive plate 300 on the free portion 111 side can be made almost the same.

Fourth Embodiment

Next, the fourth embodiment of the power generation element of the present invention will be described. The same reference numerals will be given to parts having the same structure as those of the above-described embodiments, and the description thereof will be omitted.

As shown in FIG. 7, the present embodiment is characterized in that a groove 340 is formed on the upper surface of the free portion 111 near a position where the upper surface of the free portion 111 is in contact with a corner portion of a lower surface of the magnetostrictive plate 300.

In the present invention, the amount of change in the main magnetic flux 150 becomes large, and the amount of expansion and contraction of the magnetostrictive plate 300 increases due to the magnetostrictive effect, so that the magnetostrictive plate 300 fixed on the magnetic portion 310 may come off. This is largely due to the stress concentration that occurs at the corners formed by the end of the magnetostrictive plate 300 and the upper surface of the free portion 111 of the frame yoke 110. In the present embodiment, because the groove 340 is provided on the upper surface of the free portion 111 of the frame yoke 110, the end of the magnetostrictive plate 300 is linearly connected to the end of the groove 340 to eliminate the corners. As a result, stress concentration can be prevented and the magnetostrictive plate 300 can be prevented from coming off.

The shape of the groove 340 is preferably a semicircle along the front-rear direction in the vertical cross section, but is not limited thereto. Further, it is preferable that the length of the groove 340 in the left-right direction is longer than the width of the magnetostrictive plate 300 (length in the left-right direction) and shorter than the width of the frame yoke 110, because, in this case, the durability of the frame yoke 110 will not be lowered.

The groove 340 may be provided at two positions on the upper surface of the free portion 111 in front and rear of the contact position with the corners of the magnetostrictive plate 300.

Fifth Embodiment

Next, a fifth embodiment of the power generation element of the present invention will be described. The same reference numerals will be given to parts having the same structure as those of the above-described embodiments, and the description thereof will be omitted.

Figure 8:
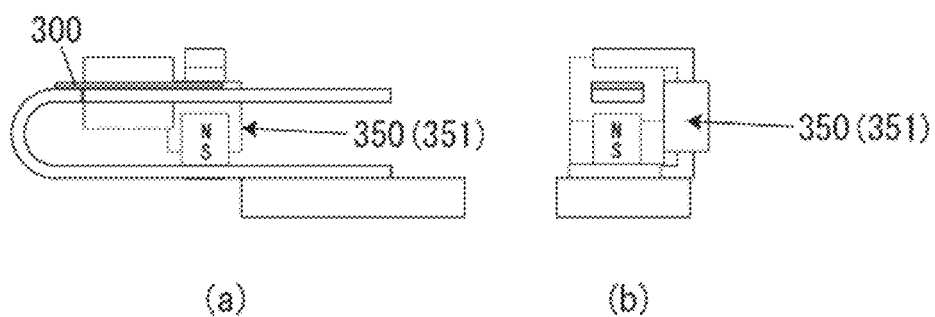
FIG. 8 includes a vertical sectional view (a) and a front view (b) showing a power generation element according to a fifth embodiment.

As shown in FIG. 8, the present embodiment is characterized in that an electromagnet 350 is used as the auxiliary magnet 220. A coil 351 constituting the electromagnet 350 is wound around the vertical portion 211 of the auxiliary yoke 210. This configuration has an advantage that the amount of magnetic bias of the auxiliary yoke 210 can be adjusted by adjusting the electric current flowing through the coil 351.

Sixth Embodiment

Next, the sixth embodiment of the power generation element of the present invention will be described. The same reference numerals will be given to the parts having the same structure as those of the above-described embodiments, and the description thereof will be omitted.

Figure 9:
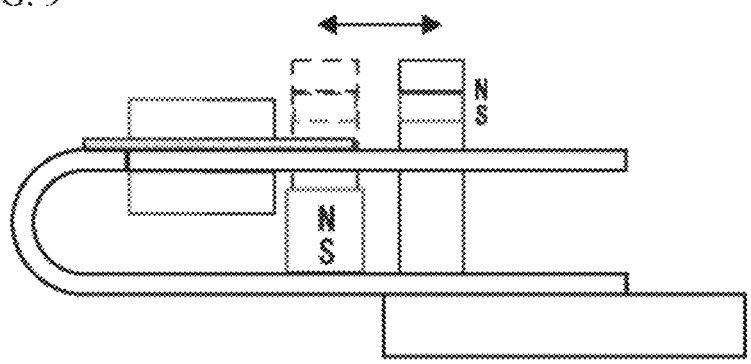
FIG. 9 is a vertical sectional view showing a power generation element according to a sixth embodiment.

As shown in FIG. 9, the present embodiment is characterized in that the position of the auxiliary yoke 210 can be changed in the front-rear direction.

The mechanism for changing the position of the auxiliary yoke 210 is not particularly limited, but examples thereof include providing a convex portion extending in the front-rear direction on the side surface of the fixed portion 113, for example, providing a concave portion extending in the front-rear direction on a side surface of the vertical portion 211 of the auxiliary yoke 210, and fixing the convex portion into the concave portion. The movement of the auxiliary yoke 210 in the front-rear direction is guided by the convex portion. By adjusting the position of the auxiliary yoke 210 in the front-rear direction, the amount of magnetic bias to each part constituting the auxiliary series magnetic circuit 200 can be adjusted.

Seventh Embodiment

Next, the seventh embodiment of the power generation element of the present invention will be described. The same reference numerals will be given to parts having the same structure as those of the above-described embodiments, and the description thereof will be omitted.

Figure 10:
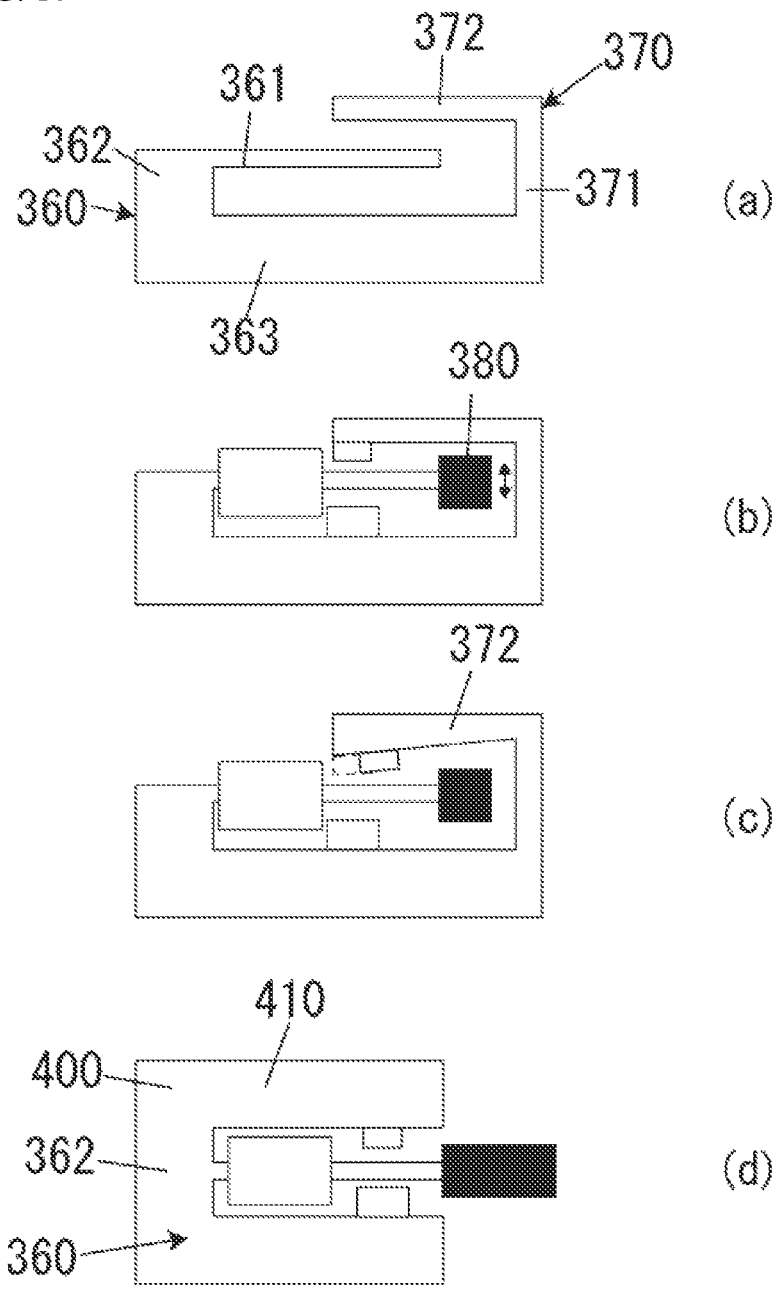
FIG. 10 includes a side view (a) showing a configuration in which a frame yoke and an auxiliary yoke according to a seventh embodiment are integrated, a side view (b) of a power generation element, and side views (c) and (d) of a modified example of the power generation element.

As shown in FIG. 10(a), the present embodiment is characterized in that a frame yoke 360 and an auxiliary yoke 370 are integrated.

The frame yoke 360 includes a free portion 361, a bent portion 362, and a fixed portion 363 as in each of the above embodiments. A vertical portion 371 of the auxiliary yoke 370 extends upward from an end of the fixed portion 363, and a horizontal portion 372 extends forward from an upper end of the vertical portion 371. The auxiliary magnet 220 is attached to a lower surface of a tip of the horizontal portion 372.

By integrating the frame yoke 360 and the auxiliary yoke 370, for example, the frame yoke 360 and the auxiliary yoke 370 can be molded in one go simply by punching out magnetic material with a mold. This contributes to cost reduction and allows mass production of the power generation elements.

As shown in FIG. 10(b), a weight 380 may be attached to a tip of the free portion 361 of the frame yoke 360. By using the weight 380 attached in this manner, the resonance frequency during vibration can be adjusted.

As shown in FIG. 10(c), the vertical length of the horizontal portion 372 of the auxiliary yoke 370 may be increased (or decreased) from the rear to the front so that a position of the auxiliary magnet 220 can be changed. By changing the position of the auxiliary magnet 220 in the front-rear direction and changing the length h2 of the second gap 230, the amount of magnetic bias to each part constituting the auxiliary series magnetic circuit 200 can be adjusted.

As shown in FIG. 10(d), a vertical portion 400 may be extended upward from the bent portion 362 of the frame yoke 360, and a horizontal portion 410 may be extended rearward from an upper end of the vertical portion 400. In this case, since a large space is secured on the tip side of the free portion 361, the amount of amplitude of the weight 380 in the vertical direction can be increased by arranging the weight 380 in this space. Further, there is an advantage that the free portion 361 can be made longer and that the coil 140 can be easily inserted from the tip side of the free portion 361.

Eighth Embodiment

Next, the eighth embodiment of the power generation element of the present invention will be described. The same reference numerals will be given to the parts having the same structure as those of the above-described embodiments, and the description thereof will be omitted.

Figure 12:
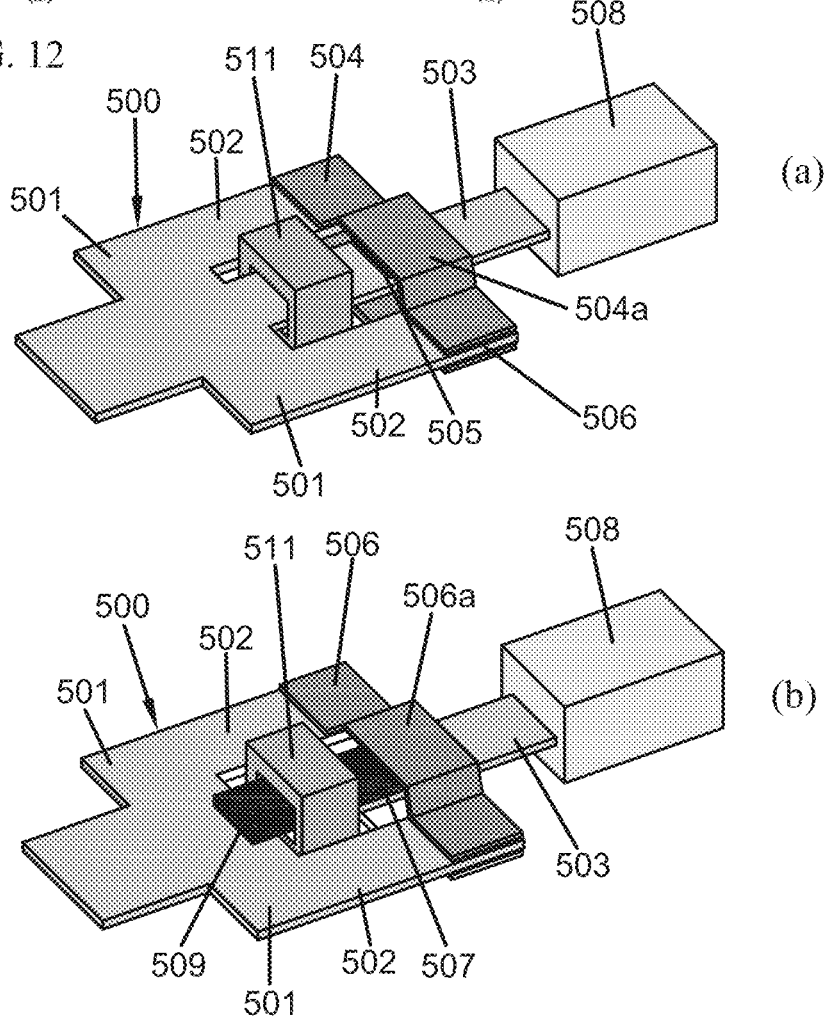
FIG. 12 includes a perspective view (a) when the power generation element according to the eighth embodiment is viewed from the right side and a perspective view (b) when the same is viewed from the left side.

As shown in FIGS. 11 and 12, the present embodiment includes a frame yoke 500 that can bend in a plane. Specifically, the frame yoke 500 has a flat shape and has two fixed portions 502, one free portion 503, and two U-shaped bend portions 501 between the fixed portions 502 and the free portion 503. Furthermore, the frame yoke 500 has a main yoke 504 that plays the role of a magnetic circuit, with tips of surfaces of the two fixed portions 502 connected to each other.

The main yoke 504 has a convex portion 504a in which the center in the longitudinal direction thereof is elevated. As shown in FIG. 11(c), the S pole side of a main magnet 505 is attached to an inner surface of the convex portion 504a of the main yoke 504.

An auxiliary yoke 506 connects tips of back surfaces of the fixed portions 502 to each other. The auxiliary yoke 506 has a convex portion 506a in which the center in the longitudinal direction thereof is elevated. As shown in FIG. 11(c), the N pole of an auxiliary magnet 507 is attached to an inner surface of the convex portion 506a of the auxiliary yoke 506.

The free portion 503 passes through a space inside the convex portions 504a and 506a from the bent portions 501 and extends further forward. A weight 508 is attached to a tip of the free portion 503. When an external force is applied to the weight 508, the tip of the free portion 503 vibrates in the vertical direction of the paper surface.

As shown in FIGS. 11(c) and 12(b), a magnetostrictive plate 509 is attached to a surface of the free portion 503 on the auxiliary yoke 506 side. The power generation effect can be obtained even if the magnetostrictive plate 509 is not attached, but a larger power generation effect can be obtained by attaching the magnetostrictive plate 509.

In the present embodiment, the portion of the free portion 503 to which the magnetostrictive plate 509 is attached corresponds to a magnetic portion 510 in the second embodiment. The magnetic portion 510 and the magnetostrictive plate 509 form a parallel beam portion. As described above, since the frame yoke 500 is made of magnetic material, the magnetic portion 510 is also made of magnetic material. A space may be secured between the magnetic portion 510 and the magnetostrictive plate 509 by making the magnetic portion 510 slightly thinner in the vertical direction.

A coil 511 is wound around the free portion 503. In the case of the configuration of the present embodiment, the trouble of winding the coil 511 to the free portion 503 can be saved by passing the free portion 503 through an air core portion of the coil 511 and then connecting the main yoke 504 and the auxiliary yoke 506 to the tips of the fixed portions 502.

A first gap 512 is a space between the surface of the free portion 503 and the N pole side of the main magnet 505. When the free portion 503 vibrates due to the application of the external force, the length h1 of the first gap 512 changes.

The main series magnetic circuit includes the frame yoke 500 (fixed portions 502, main yoke 504, and free portion 503), the main magnet 505, and the first gap 512. As shown in FIG. 11, a main magnetic flux 513 passing through the main series magnetic circuit exits from the N pole of the main magnet 505, passes through the first gap 512, the free portion 503, the fixed portions 502, and the main yoke 504, and returns to the S pole of the main magnet 505. The main series magnetic circuit is one closed magnetic circuit, and each part constituting the main series magnetic circuit is magnetically biased by the main magnetic flux 513.

In the present embodiment, since the magnetostrictive plate 509 extends to the immediate vicinity of the auxiliary magnet 507 as shown in FIG. 12(b), a second gap 514 corresponds to a space between the S pole side of the auxiliary magnet 507 and a surface of the magnetostrictive plate 509. The magnetostrictive plate 509 may be made short so that the space between the S pole side of the auxiliary magnet 507 and the free portion 503 (the portion of the magnetic material other than the magnetostrictive plate 509) may be used as the second gap 514.

When the free portion 503 vibrates due to the application of the external force, the length h2 of the second gap 514 changes. That is, when the free portion 503 moves to the auxiliary magnet 507 side due to the application of the external force and the length h1 of the first gap 512 increases, the length h2 of the second gap 514 decreases, while, when the free portion 503 moves toward the main magnet 505 side and the length h1 of the first gap 512 decreases, the length h2 of the second gap 514 increases. In other words, a bigger gap is divided into the first gap 512 and the second gap 514 by the free portion 503, and the lengths h1 and h2 reciprocally increase or decrease with the vibration of the free portion 503. The lengths h1 and h2 need to be set to such a value that prevents the vibrating free portion 503 from contacting the main magnet 505 and the auxiliary magnet 507.

The auxiliary series magnetic circuit includes the auxiliary yoke 506, the auxiliary magnet 507, the second gap 514, the frame yoke 500 (fixed portions 502, main yoke 504, and free portion 503), the main magnet 505 and the first gap 512. As shown in FIG. 11, an auxiliary magnetic flux 515 passing through the auxiliary series magnetic circuit exits from the N pole of the auxiliary magnet 507, passes through the auxiliary yoke 506 from the fixed portions 502, passes through the main yoke 504, the main magnet 505, the first gap 512, the free portion 503 and the second gap 514, and returns to the S pole of the auxiliary magnet 507. The auxiliary series magnetic circuit is one closed magnetic circuit, and each part constituting the auxiliary series magnetic circuit is magnetically biased by the auxiliary magnetic flux 515.

Since the neutral axis (position where the stress is zero) of the parallel beam portion is in the magnetic portion 510, the stress inside the magnetostrictive plate 509 becomes uniform compression when the free portion 503 is moved to the auxiliary magnet 507 side due to vibration, and when the free portion 503 is moved to the main magnet 505 side, the stress inside the magnetostrictive plate 509 becomes uniform tension. As a result, the main magnetic flux 513 passing through the magnetostrictive plate 509 decreases when the free portion 503 moves to the auxiliary magnet 507 side due to the inverse magnetostrictive effect, and increases when the free portion 503 moves to the main magnet 505 side.

As described in the first embodiment, when the free portion 503 moves to the auxiliary magnet 507 side, the length h1 of the first gap 512 increases as compared with that in the stationary state, so that the magnetic resistance of the first gap 512 increases, and the magnetic resistance of the second gap 514 also decreases since the length h2 of the second gap 514 decreases. The main magnetic flux 513 decreases due to the increase in the magnetic resistance of the first gap 512, and the magnetic flux of the main magnetic flux 513 further decreases due to the compression of the magnetostrictive plate 509. However, since the magnetic flux equivalent to the reduced magnetic passes through the auxiliary series magnetic circuit, the auxiliary magnetic flux 515 increases.

On the other hand, when the free portion 503 moves to the main magnet 505 side, the length h1 of the first gap 512 decreases as compared with that in the stationary state, so that the magnetic resistance of the first gap 512 also decreases, and the magnetic resistance of the second gap 514 increases since the length h2 of the second gap 514 increases. The main magnetic flux 513 increases due to the decrease in the magnetic resistance of the first gap 512, and the magnetic flux density of the main magnetic flux 513 further increases due to the extension of the magnetostrictive plate 509. Further, the auxiliary magnetic flux 515 decreases due to the increase in the magnetic resistance of the second gap 514, but the magnetic flux equivalent to the reduced magnetic passes through the main series magnetic circuit, so that the main magnetic flux 513 increases.

In this way, the electromotive force can be further increased as compared with that in the configuration of the first embodiment, since the timing of decrease/increase of the magnetic flux of the main magnetic flux 513 as the magnetic resistances of the first gap 512 and the second gap 514 increase/decrease reciprocally due to the vibration of the free portion 503 and the timing of decrease/increase of the magnetic flux of the main magnetic flux 513 due to the change of the compressive stress/tensile stress generated in the magnetostrictive plate 509 can be matched.

In the case of the configuration of the present embodiment, the frame yoke having the fixed portions 502 and the free portion 503 has a flat shape and can be integrally molded by punching or the like. Therefore, the manufacturing cost can be suppressed as compared with the case where the frame yoke 500 is molded by bending or the like as in the first embodiment. Further, the movable range of the weight 508 can be increased as compared with that in the configuration of the first embodiment. Further, as shown by an arrow B in FIG. 11(*d*), the height of the convex portion 504*a* or the convex portion 506*a* can be changed by deforming the main yoke 504 or the auxiliary yoke 506, so that the length h1 of the first gap 512 and the length h2 of the second gap 514 can be easily adjusted.

As shown in FIGS. 13(*a*) and 13(*b*), a wind receiving member 516 may be attached to the tip of the free portion 503. When the cross section of the wind receiving member 516 is made semicircular and a plane portion thereof is a wind receiving surface 517, the wind receiving surface 517 receives the wind indicated by an arrow C, and it is possible to vibrate the free portion 503 by using a galloping phenomenon or a Karman vortex row formed behind the wind receiving member 516. The free portion 503 can be vibrated in the same way by using water flow instead of wind.

Further, as shown in FIGS. 13(*c*) and 13(*d*), the frame yoke may include one fixed portion 502, one free portion 503, and one U-shaped bent portion 501 between the fixed portion 502 and the free portion 503. Further, the frame yoke may include a main yoke 518 extending from a tip of the surface of the fixed portion 502 to the vicinity of the free portion 503. In this configuration, an auxiliary yoke 519 may be extended from a tip of the back surface of the fixed portion 502 to the vicinity of the free portion 503. The main yoke 518 includes a convex portion 518*a*, and the auxiliary yoke 519 includes a convex portion 519*a*. In this configuration, the structure can be simplified and the manufacturing cost can be suppressed as compared with those in the configuration including the two fixed portions 502 shown in FIG. 11. On the other hand, in the case of the configuration including the two fixed portions 502 shown in FIG. 11, there is an advantage that the flow of magnetic flux can be made smooth and the rigidity can be increased since the width of the fixed portions 502 as a part of the frame yoke can be widened.

Example 1

A simulation was performed on the amount of change in the magnetic flux and the amount of change in the magnetic flux density of the power generation element of the present invention.

Figure 15:
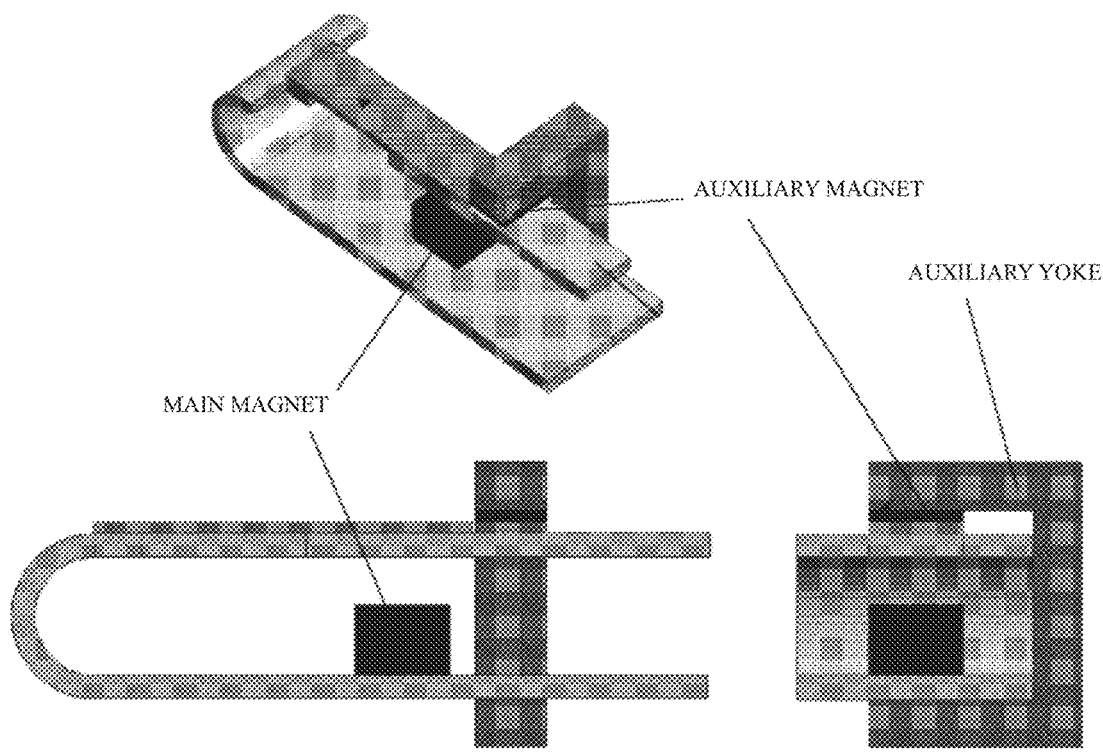
FIG. 15 is a diagram showing a structure of Model 2 of Example 1.
Figure 16:
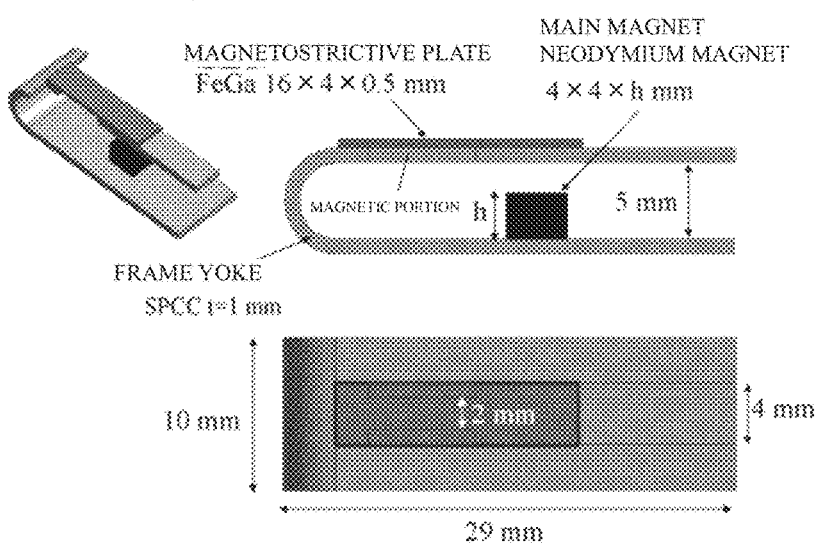
FIG. 16 is a diagram showing a structure of Model 3 of Example 1.

Model 1 represents a configuration including a magnetostrictive plate, a magnetic portion, an auxiliary yoke, and an auxiliary magnet (FIG. 14). Model 2 represents a configuration that uses magnetic material (SPCC material) instead of a magnetostrictive plate, and includes a magnetic portion, an auxiliary yoke, and an auxiliary magnet (FIG. 15). Model 3 represents a configuration including a magnetostrictive plate and a magnetic portion without an auxiliary yoke and an auxiliary magnet (FIG. 16). Model 1 and Model 2 represent comparative examples of the configuration that are included in the power generation element of the present invention but Model 3 represents a comparative example of the configuration that is not included in the present invention.

FIG. 17 shows a calculation method of the magnetic flux density, and FIG. 18 shows a magnetic flux density calculation model (when compressive stress is applied, when there is no stress and when tensile stress is applied).

FIGS. 19 to 21 show simulation results of Models 1 to 3.

From a table of FIG. 22, it was found that the amount of change in magnetic flux and the amount of change in magnetic flux density were particularly large for Models 1 and 3 that are provided with an auxiliary yoke and an auxiliary magnet, that is, in the case of a configuration including an auxiliary series magnetic circuit. Further, it was found that among Models 1 and 3, Model 1 provided with a magnetostrictive plate had a larger amount of change in magnetic flux and a larger amount of change in magnetic flux density.

Example 2

The amount of power generated by the power generation element having a magnetostrictive plate and not having an auxiliary series magnetic circuit and the amount of power generated by the power generation element having a magnetostrictive plate and having an auxiliary series magnetic circuit were compared.

Photographs of prototype power generation elements are shown in FIG. 23. FIG. 23(a) shows a power generation element having no auxiliary series magnetic circuit, and FIGS. 23(b) and 23(c) show power generation elements having an auxiliary series magnetic circuit.

The magnetostrictive plate is 4×0.5×16 mm made of Fe—Ga alloy, the thickness of the frame (bainite steel) is 0.5 mm, and the coil had 1494 turns (resistance value is 59.3Ω). The main magnet is a permanent magnet, the dimensions of which are 5×3×3 mm for power generation elements without an auxiliary series magnetic circuit, and 5×5×2 mm and 3×4×2 mm stacked one above the other for power generation elements with an auxiliary series magnetic circuit. The auxiliary magnet used in the auxiliary series magnetic circuit is also a permanent magnet, the dimensions of which are 2×3×1 mm.

The auxiliary yoke of the auxiliary series magnetic circuit was U-shaped as in FIG. 14, and was attached to the lower surface of the fixed portion of the frame yoke. An appropriate gap was secured between the auxiliary magnet and the magnetostrictive plate to form the second gap. Each power generation element is attached to the vibrator as shown in FIG. 24, and vibrated so that the displacements of the end of the magnetostrictive plate were the same at each resonance frequency (120 Hz for the power generation element without the auxiliary series magnetic circuit, 115.1 Hz for the power generation element with the auxiliary series magnetic circuit). The displacement of the end of the magnetostrictive plate was measured with a known laser displacement sensor.

Figure 25:
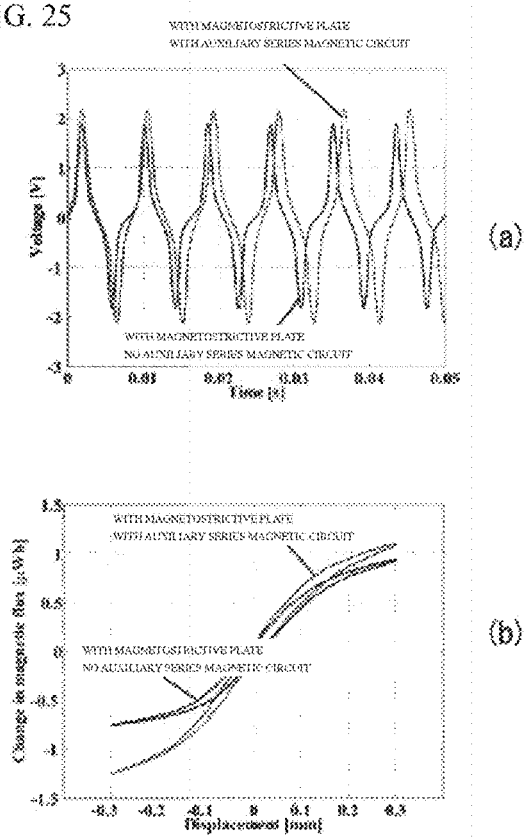
FIG. 25 includes a graph (a) showing a temporal change of an open circuit voltage and a graph showing a relationship between the magnetic flux and displacement.

As a result, the open circuit voltage shown in FIG. 25(a) was generated. When the auxiliary series magnetic circuit was provided, the generated voltage increased by 20.0% even though the frequency was lower than when it was not provided. FIG. 25(b) shows a relationship between the displacement of the end of the magnetostrictive plate and the magnetic flux calculated by integrating the generated voltage. From this relationship, it can be understood that the increase in the generated voltage is due to the increase in the magnetic flux due to the effect of the auxiliary series magnetic circuit.

Example 3

Comparison of power generation between a power generation element that has magnetic material (SPCC) instead of a magnetostrictive element and no auxiliary series magnetic circuit, and a power generation element that has magnetic material (SPCC) instead of a magnetostrictive element and an auxiliary series magnetic circuit was made.

The dimensions of the magnetic material (SPCC material) used as a substitute for the magnetostrictive plate were 4×0.5×16 mm.

The thickness of the frame (bainite steel) was 1.0 mm, and the coil had 1494 turns (resistance value was 59.3Ω). The main magnet was a permanent magnet, and the dimensions of which were 5×5×2 mm and 3×4×2 mm, which were stacked one above the other. Further, the auxiliary magnet used in the auxiliary series magnetic circuit was also a permanent magnet, and the dimensions of which were 3×4×1 mm.

The auxiliary yoke of the auxiliary series magnetic circuit was U-shaped as in FIG. 14, and was attached to the lower surface of the fixed portion of the frame yoke. An appropriate gap was provided between the auxiliary magnet and the SPCC material to form the second gap. Each power generation element was attached to the vibrator and vibrated at each resonance frequency (115.6 Hz) so that the displacement of the end of the SPCC material was the same. The displacement was set to 3 patterns of 0.1 mm, 0.2 mm, and 0.3 mm. The displacement of the end of the SPCC material was measured with a known laser displacement sensor.

Figure 26:
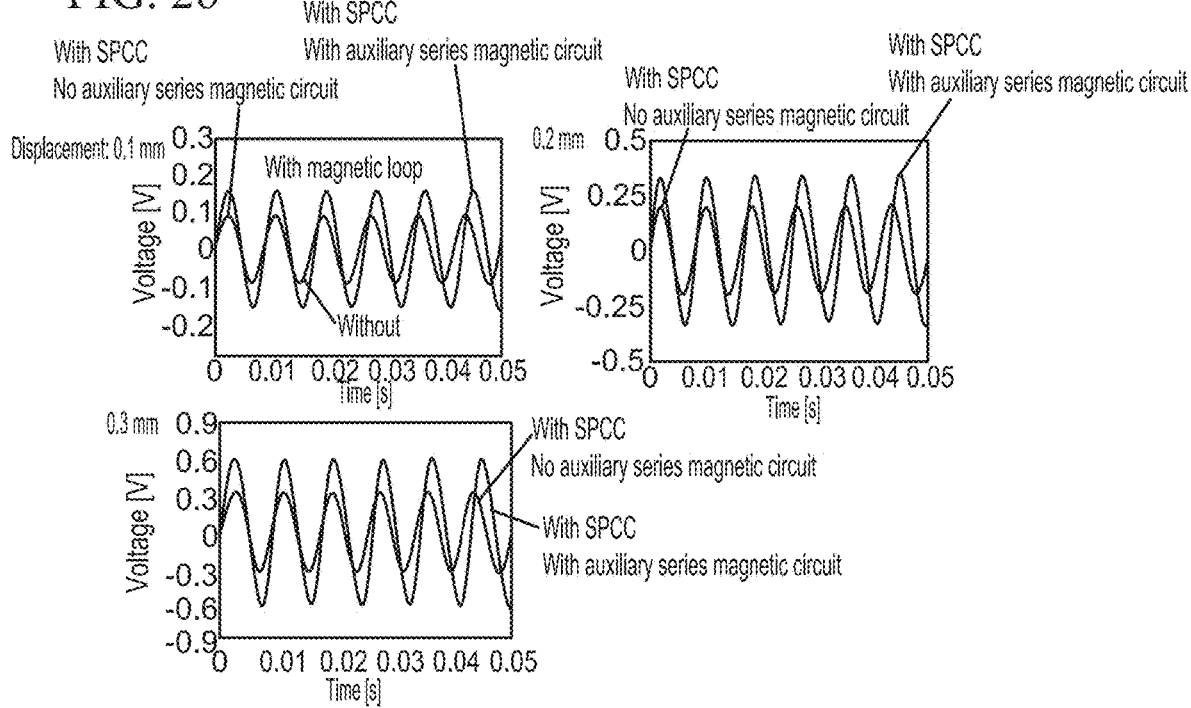
FIG. 26 includes graphs showing a temporal change of the open circuit voltage of a power generation element of Example 3.
Figure 27:
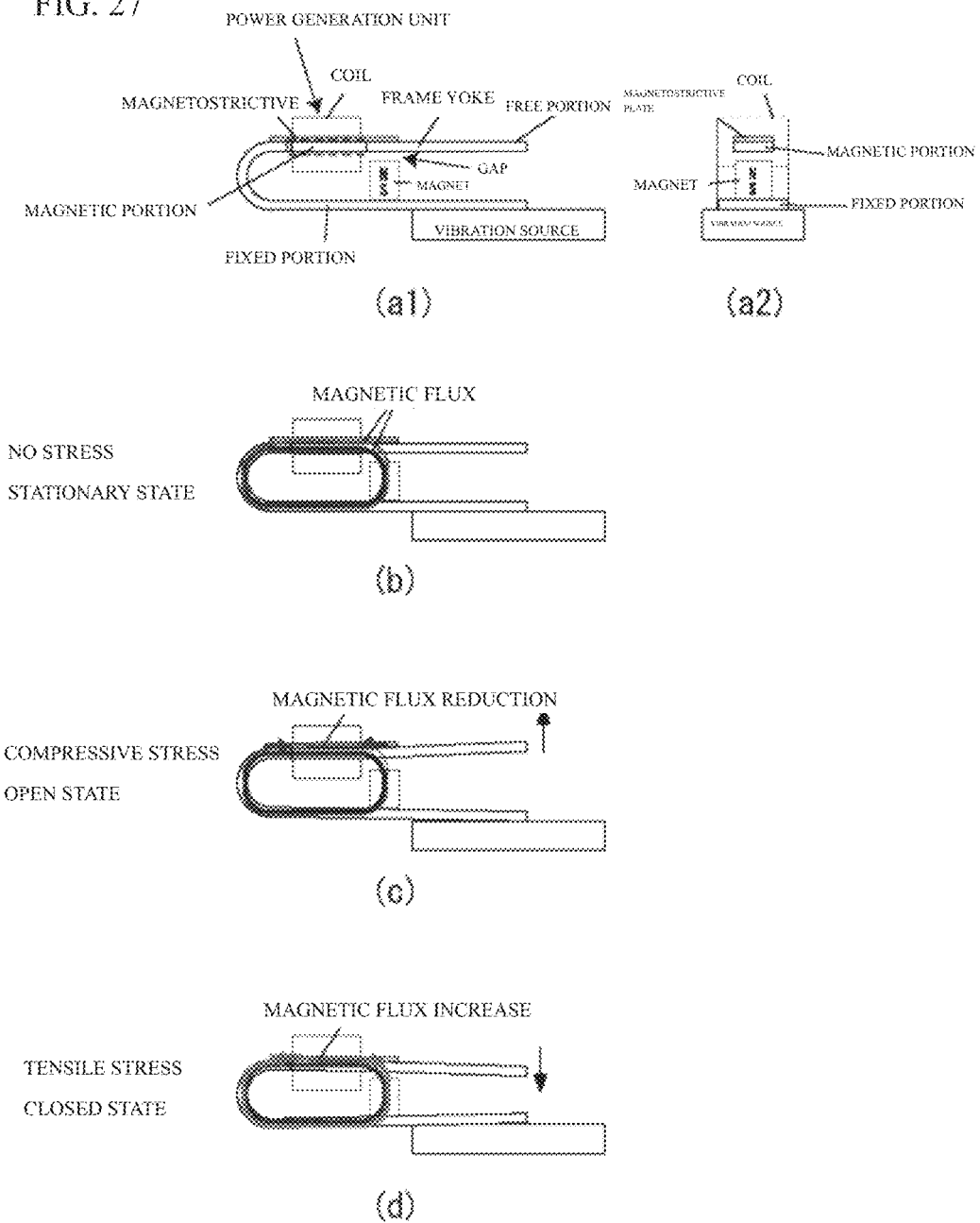
FIG. 27 includes a vertical cross-sectional view (a1) and a front view (a2) showing a structure of a conventional power generation element, a vertical cross-sectional view (b) showing the power generation element in a stationary state, a vertical cross-sectional view (c) showing the power generation element in an open state, and a vertical sectional view (d) showing the power generation element in a closed state.
Figure 28:
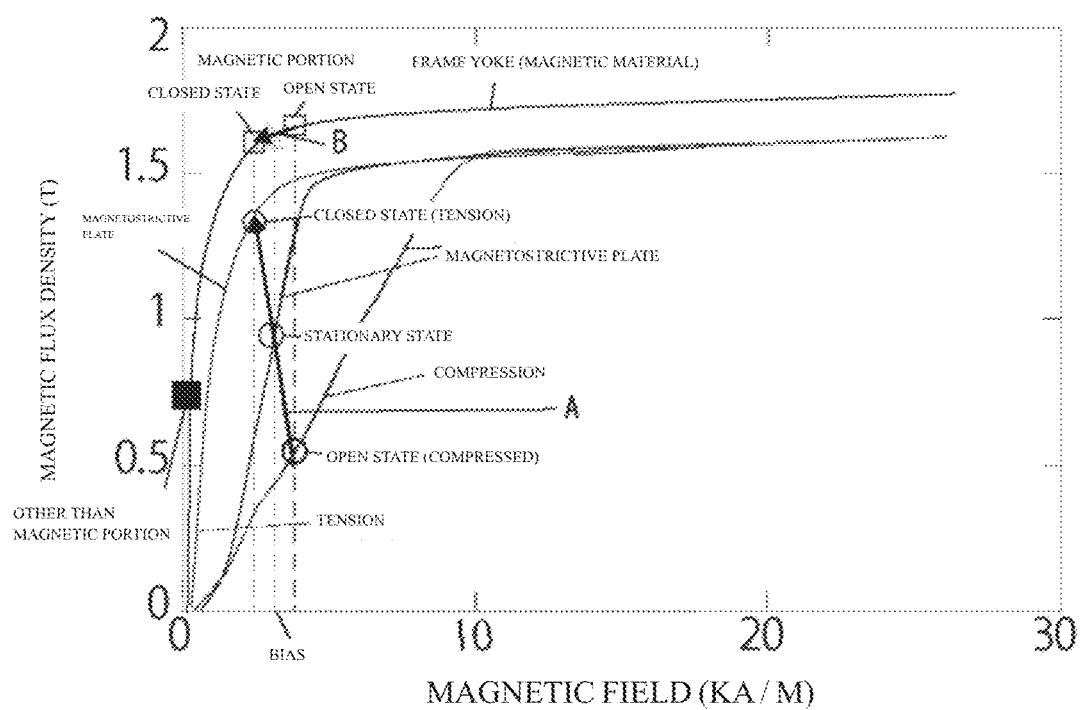
FIG. 28 is a graph of magnetization curves of a frame yoke and a magnetostrictive plate of the conventional power generation element in the stationary state, the open state, and the closed state.

As a result, the open circuit voltage shown in FIG. 26 was generated. When the auxiliary series magnetic circuit was provided, the generated voltage increased as compared with the case where the auxiliary series magnetic circuit was not provided, but the generated voltage was lower than that of the power generation element provided with the magnetostrictive plate and the auxiliary series magnetic circuit shown in Example 2. It was also found that the larger the displacement, the larger the generated voltage.

INDUSTRIAL APPLICABILITY

The present invention relates to a power generation element and an actuator for vibration power generation that can be mass-produced at low cost while achieving increase in the electromotive force, and has industrial applicability.

NUMERAL REFERENCES 1 power generation element
2 power generation element
100 main series magnetic circuit
110 frame yoke
111 free portion
112 bent portion
113 fixed portion
120 main magnet
130 first gap
140 coil
150 main magnetic flux
200 auxiliary series magnetic circuit
210 auxiliary yoke
211 vertical portion
212 horizontal portion
213 second horizontal portion
220 auxiliary magnet
230 second gap
240 auxiliary magnetic flux
300 magnetostrictive plate
310 magnetic portion
320 parallel beam portion 330 spacer
340 groove
350 electromagnet
351 coil
360 frame yoke
361 free portion
362 bent portion
363 fixed portion
370 auxiliary yoke
371 vertical portion
372 horizontal portion
380 weight
400 vertical portion
410 horizontal portion
500 frame yoke
501 U-shaped bent portion
502 fixed portion
503 free portion
504 main yoke
504a convex portion
505 main magnet
506 auxiliary yoke
506a convex portion
507 auxiliary magnet
508 weight
509 magnetostrictive plate
510 magnetic portion
511 coil
512 first gap
513 main magnetic flux
514 second gap
515 auxiliary magnetic flux
516 wind receiving member
517 wind receiving surface
518 main yoke
518a convex portion
519 auxiliary yoke
519a convex portion

The invention claimed is:

1. A power generation element comprising a main series magnetic circuit and an auxiliary series magnetic circuit, wherein
the main series magnetic circuit includes:
a frame yoke made of magnetic material and provided with a fixed portion and a free portion,
a main magnet that applies a magnetic bias to the frame yoke, and
a first gap formed at a position in contact with the free portion; and
the auxiliary series magnetic circuit includes:
an auxiliary yoke made of magnetic material and attached to the frame yoke,
an auxiliary magnet that applies a magnetic bias to the auxiliary yoke, and
a second gap formed at a position facing the first gap across the free portion,
the frame yoke,
the main magnet, and
the first gap,
wherein, a magnetic flux passing through the main series magnetic circuit represents a main magnetic flux, a magnetic flux passing through the auxiliary series magnetic circuit represents an auxiliary magnetic flux, and directions of the main magnetic flux and the auxiliary magnetic flux passing through the first gap are the same, and
wherein the free portion vibrates due to application of an external force and a magnetic resistance of the first gap and a magnetic resistance of the second gap increase or decrease reciprocally as a result of the free portion vibrating.

2. The power generation element as claimed in claim 1, wherein one end of the frame yoke is the fixed portion and the other end is the free portion with a U-shaped bent portion in between the free portion and the fixed portion.

3. The power generation element as claimed in claim 1, further comprising:
a magnetic portion formed in a part of the frame yoke; and
a magnetostrictive plate made of magnetostrictive material,
wherein the magnetic portion has rigidity and shape that allows applying a uniform compressive force or tensile force to the magnetostrictive plate;
wherein the magnetostrictive plate is attached to the frame yoke so as to be parallel to the magnetic portion; and
wherein the magnetostrictive plate expands or contracts due to the application of an external force.

4. An actuator having the same structure as the power generation element as claimed in claim 1, wherein a length of the first gap changes and the free portion vibrates when an electric current passes through the coil.

5. An actuator having the same structure as the power generation element as claimed in claim 3, wherein the magnetostrictive plate is expanded and contracted and the free portion vibrates when an electric current passes through the coil.

6. The power generation element as claimed in claim 2, further comprising:
a magnetic portion formed in a part of the frame yoke; and
a magnetostrictive plate made of magnetostrictive material,
wherein the magnetic portion has rigidity and shape that allows applying a uniform compressive force or tensile force to the magnetostrictive plate;
wherein the magnetostrictive plate is attached to the frame yoke so as to be parallel to the magnetic portion; and
wherein the magnetostrictive plate expands or contracts due to the application of an external force.

7. An actuator having the same structure as the power generation element as claimed in claim 6, wherein the magnetostrictive plate is expanded and contracted and the free portion vibrates when an electric current passes through the coil.

8. An actuator having the same structure as the power generation element as claimed in claim 2, wherein a length of the first gap changes and the free portion vibrates when an electric current passes through the coil.

* * * * *